(12) United States Patent
Ando

(10) Patent No.: US 8,149,542 B2
(45) Date of Patent: Apr. 3, 2012

(54) WIRING CONNECTING STRUCTURE FOR PIEZOELECTRIC ELEMENT, WIRING CONNECTING METHOD, PIEZOELECTRIC ACTUATOR, AND HEAD SUSPENSION

(75) Inventor: Toshiki Ando, Aikoh-gun (JP)

(73) Assignee: NHK Spring Co., Ltd., Kanagawa (JP)

( * ) Notice: Subject to any disclaimer, the term of this patent is extended or adjusted under 35 U.S.C. 154(b) by 277 days.

(21) Appl. No.: 12/643,031

(22) Filed: Dec. 21, 2009

(65) Prior Publication Data

US 2010/0165515 A1 Jul. 1, 2010

(30) Foreign Application Priority Data

Dec. 25, 2008 (JP) .............................. P2008-329222

(51) Int. Cl.
*G11B 5/55* (2006.01)
*G11B 5/56* (2006.01)
(52) U.S. Cl. ................ 360/245.8; 310/323.06; 310/363; 310/364; 310/365; 360/245.9; 360/294.4
(58) Field of Classification Search ....... 360/245.8–246, 360/264.2, 294.4; 310/323.06, 363–366
See application file for complete search history.

(56) References Cited

U.S. PATENT DOCUMENTS

| 6,731,472 B2 | 5/2004 | Okamoto et al. |
| 6,741,012 B2 | 5/2004 | Koganezawa et al. |
| 7,440,236 B1 * | 10/2008 | Bennin et al. .............. 360/294.4 |

FOREIGN PATENT DOCUMENTS

| JP | 2002-050140 | 2/2002 |
| JP | 2003-061371 | 2/2003 |

* cited by examiner

*Primary Examiner* — Allen Heinz
(74) *Attorney, Agent, or Firm* — Jordan and Hamburg LLP

(57) ABSTRACT

A wiring connecting structure for a piezoelectric element is capable of performing wiring to the piezoelectric element without deteriorating the quality and reliability of the piezoelectric element. The piezoelectric element is arranged between a base and head of an object, to minutely move the head in a sway direction according to deformation that occurs on the piezoelectric element in response to a voltage applied from a terminal to an electrode of the piezoelectric element. The wiring connecting structure includes first and second liquid stoppers arranged between the terminal and the electrode, the second liquid stopper being arranged outside the first liquid stopper. The wiring connecting structure also includes an adhesive part to connect the electrode to the terminal. The adhesive part has a conductive adhesive part defined by the first liquid stopper and a sealing adhesive part defined by the second liquid stopper. The sealing adhesive part seals the first liquid stopper and conductive adhesive part.

12 Claims, 18 Drawing Sheets

Fig.5(a) External view of wiring member seen from below head suspension
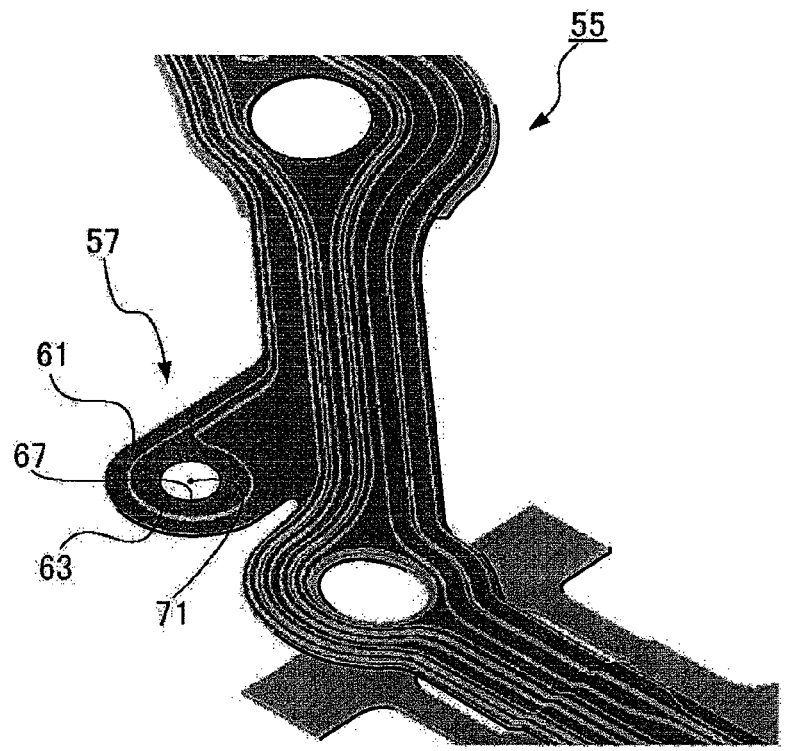
Fig.5(b) External view of wiring member seen from piezoelectric element
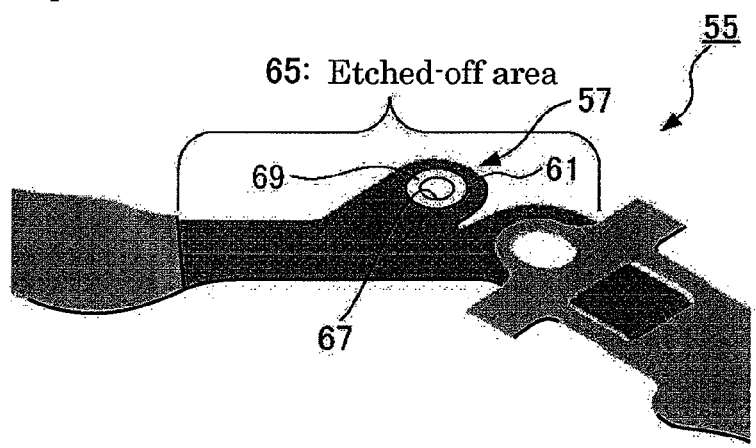

Fig.6(a) Front view
Fig.6(b) Right side view
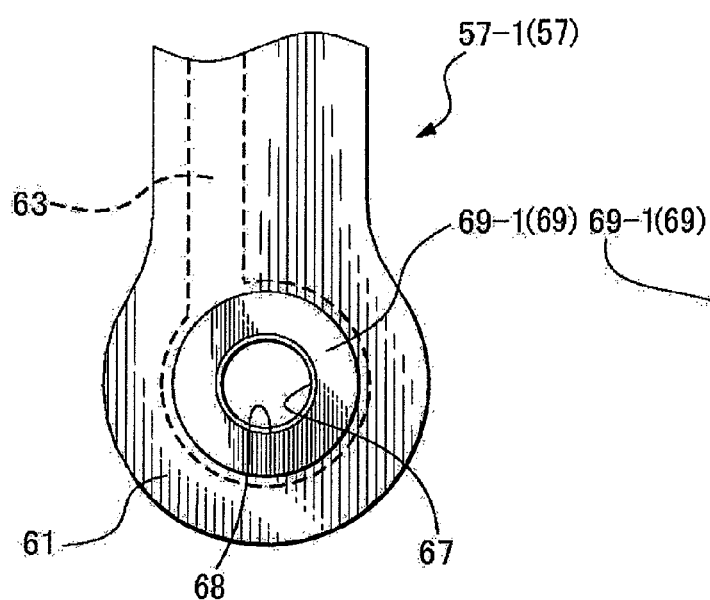
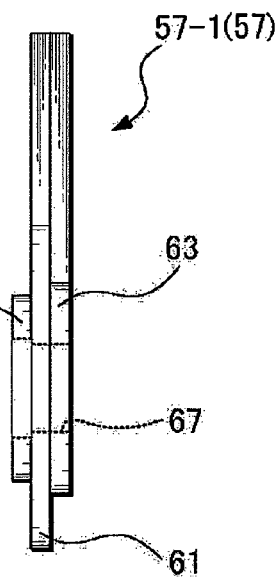
Fig.6(c) Sectional view of attached state
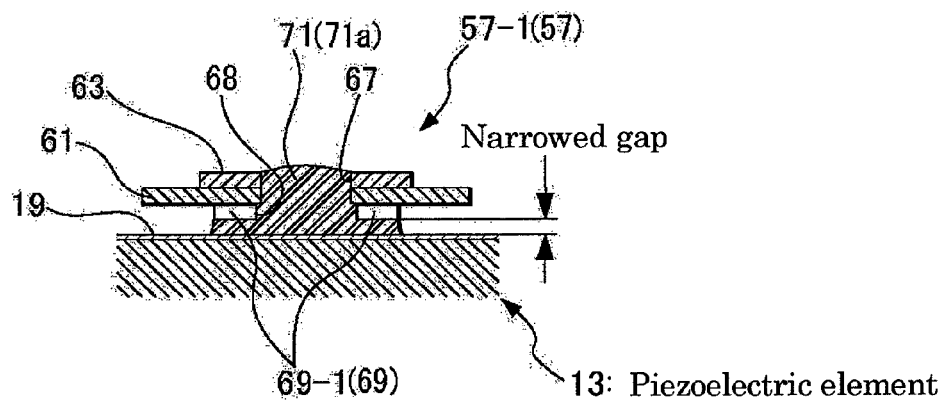

Fig.7(a) Front view
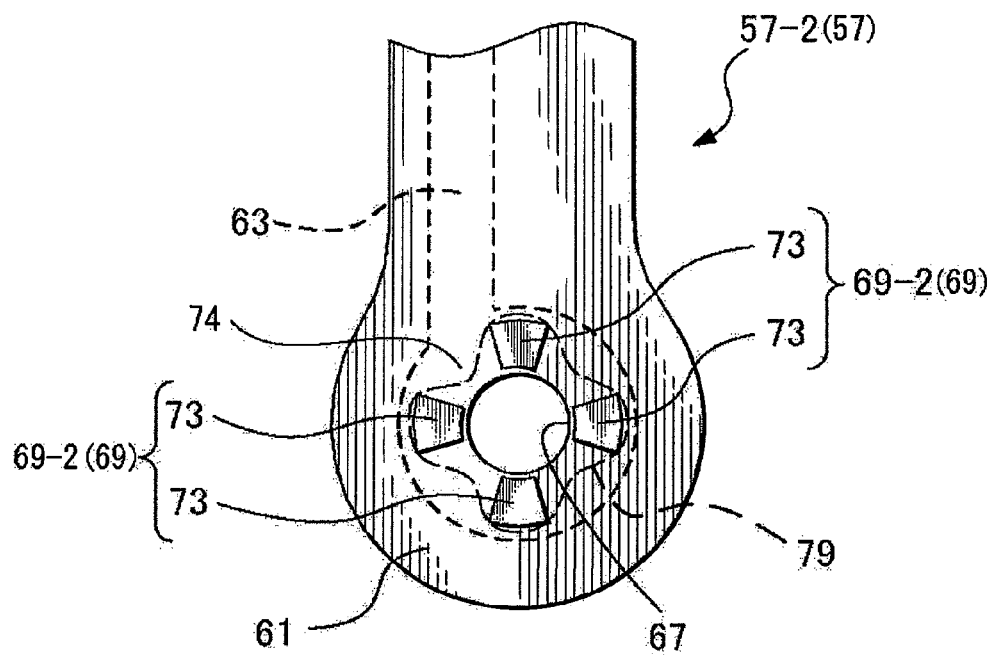
Fig.7(b) Sectional view of attached state
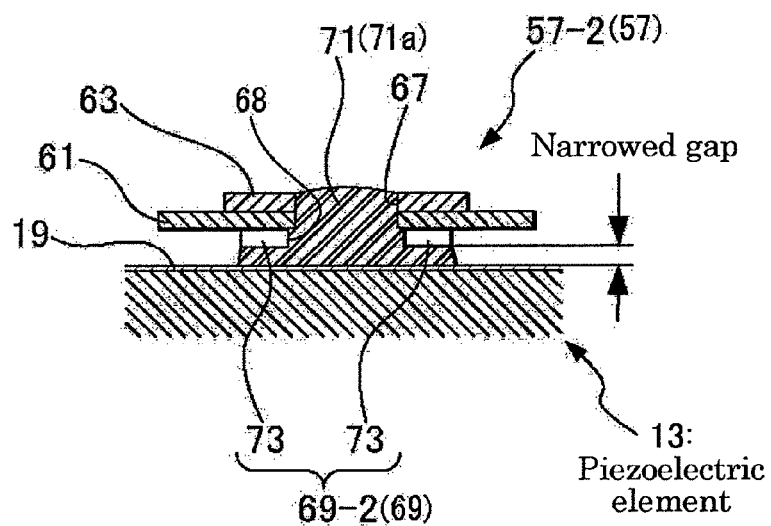

Fig.8(a) Front view
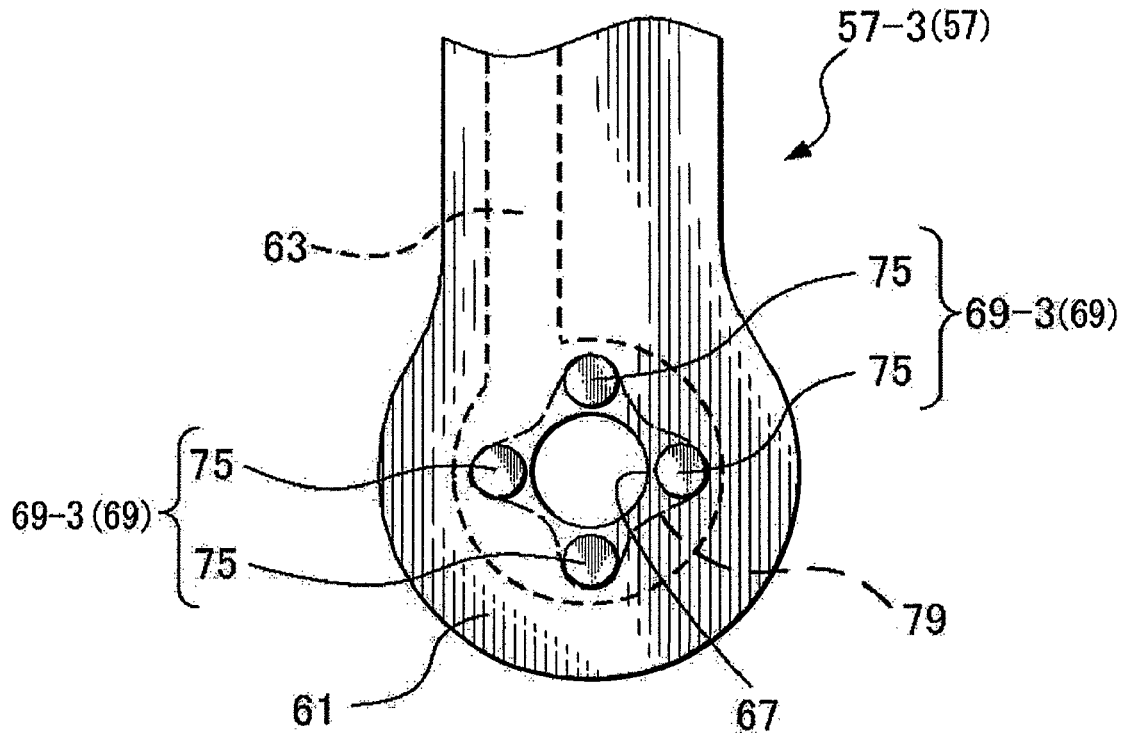
Fig.8(b) Sectional view of attach
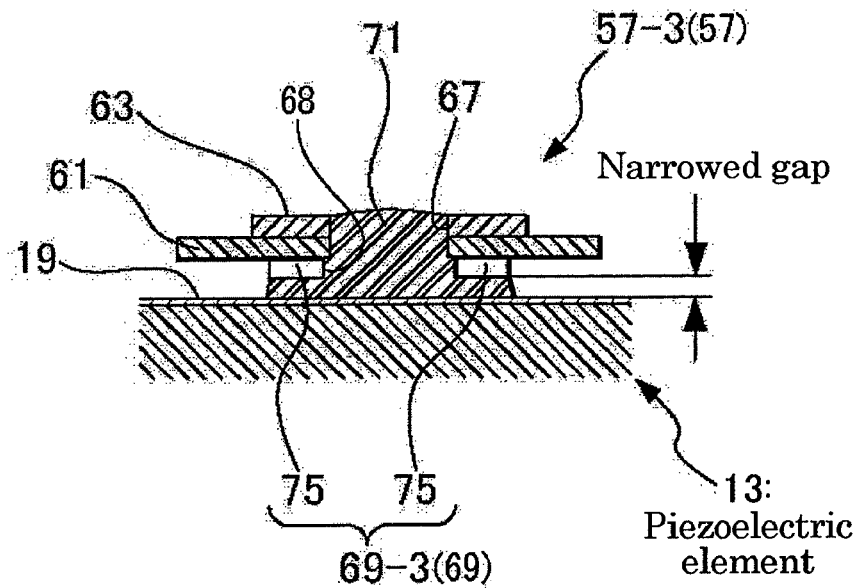

Fig.9(a) Front view
Fig.9(b) Right side view
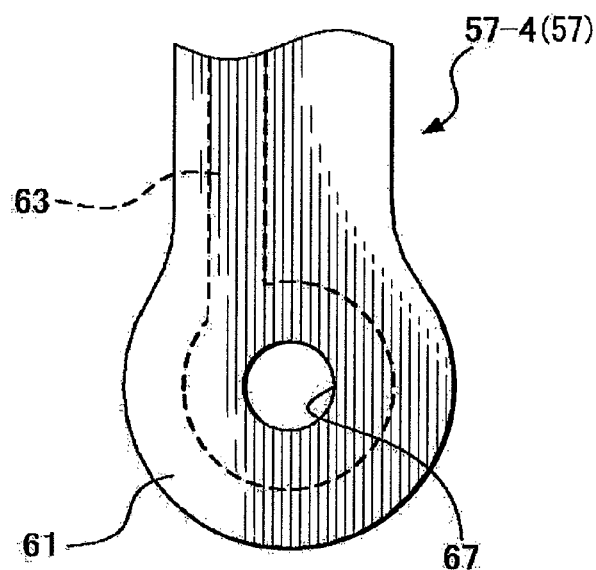
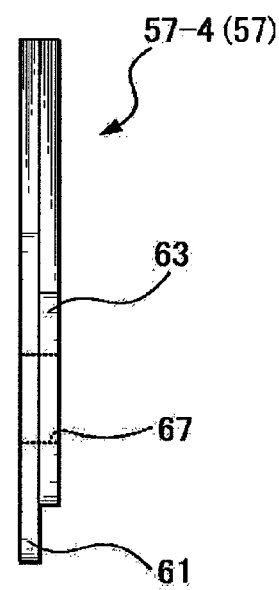
Fig.9(c) Sectional view of attached state
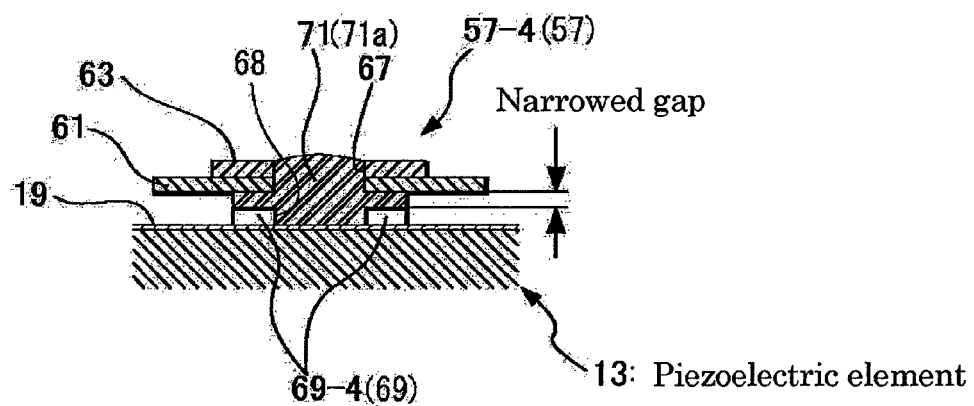

Fig.10(a) Problem 1
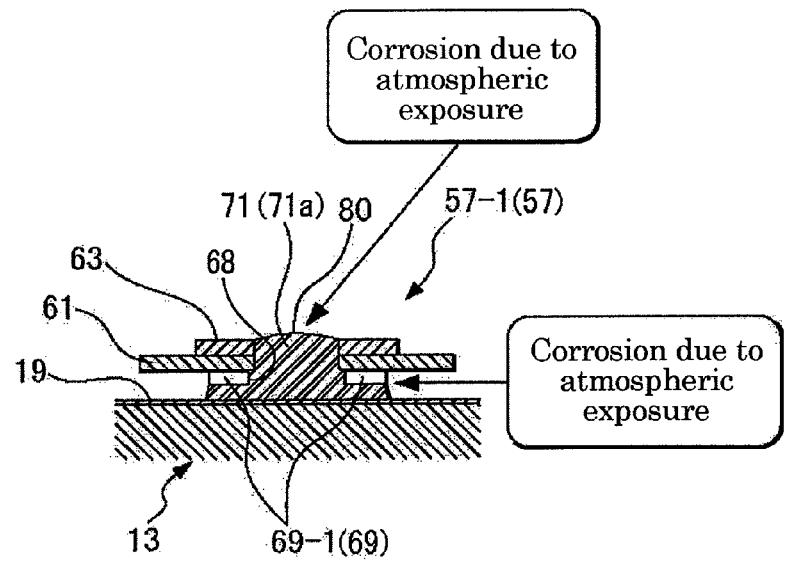
Fig.10(b) Problem 2
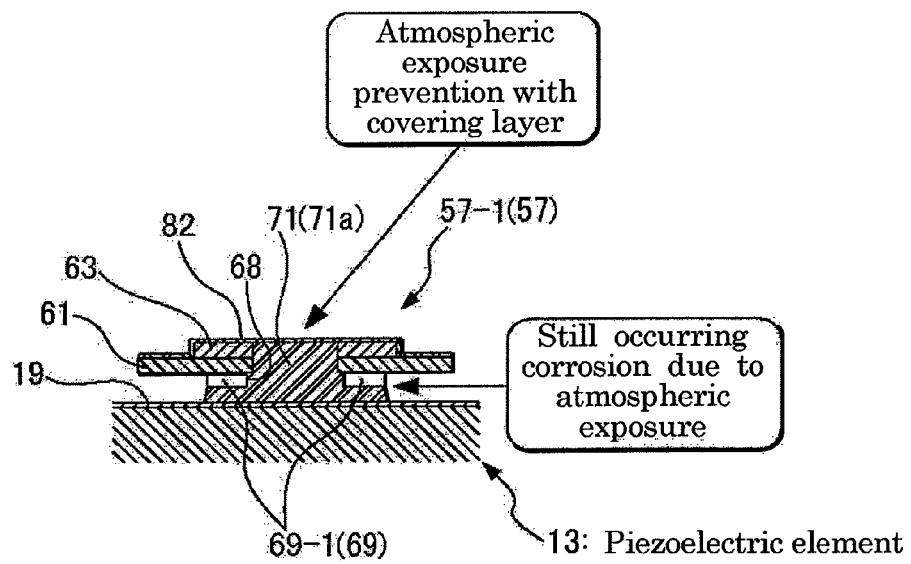

Fig.11(a) Front view
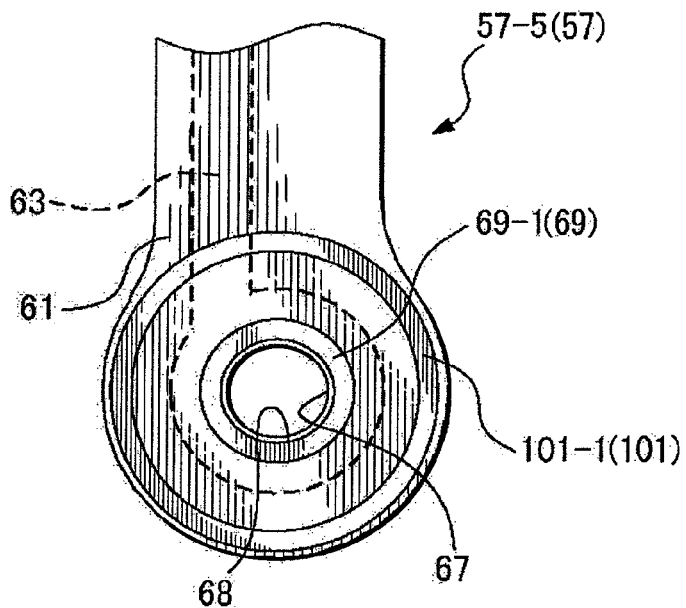
Fig.11(b) Sectional view of attached state
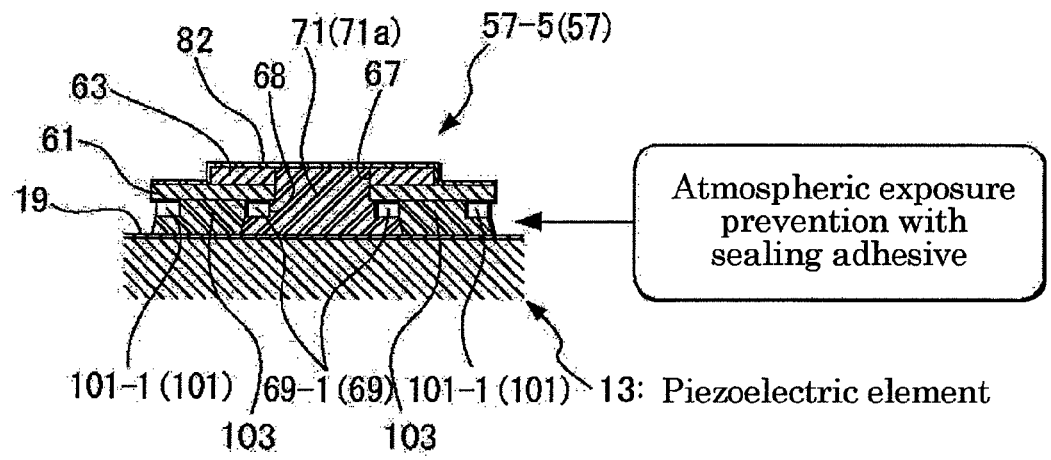
Atmospheric exposure prevention with sealing adhesive
13: Piezoelectric element Fig. 12(a) First attaching process
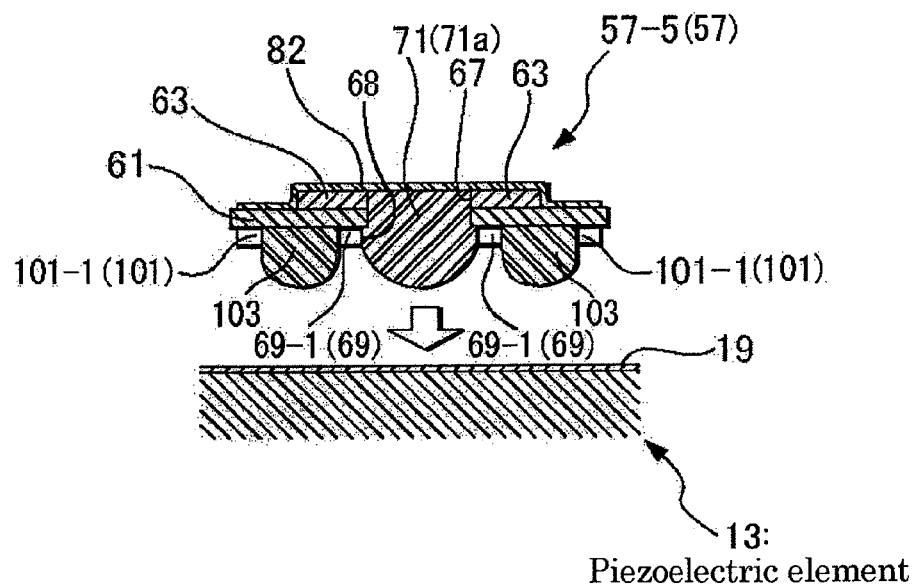
Fig. 12(b) Second attaching process
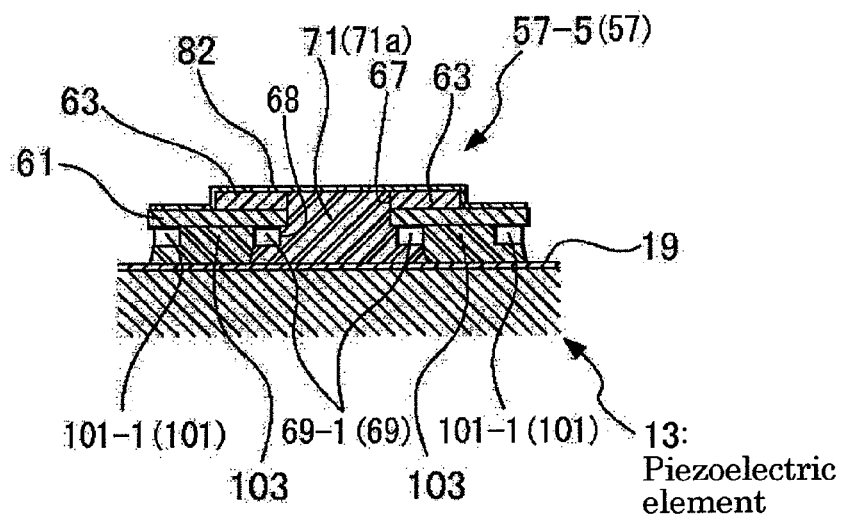

Fig.13(a) Front view
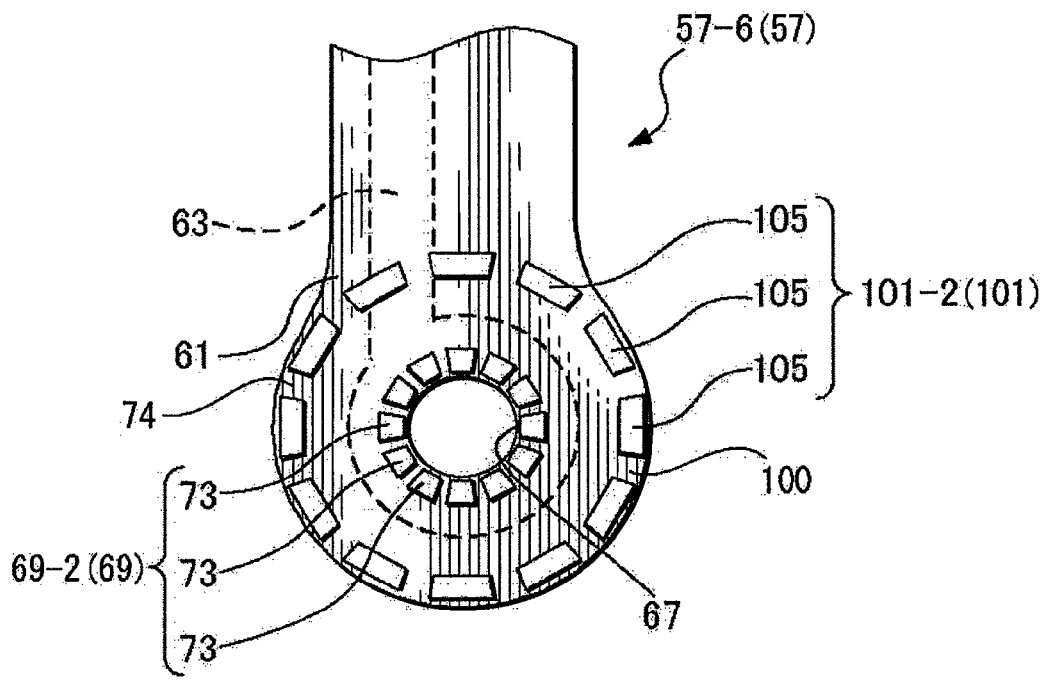
Fig.13(b) Sectional view of attached state
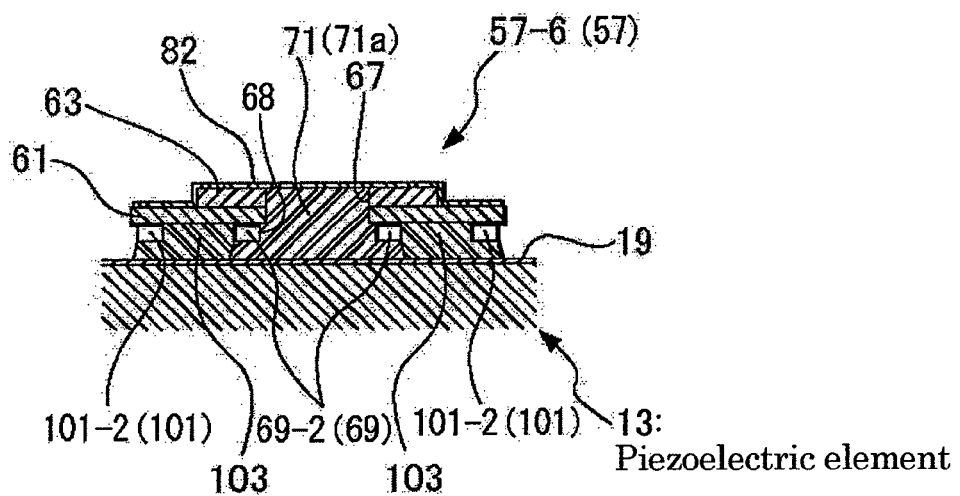
13: Piezoelectric element Fig.14(a) Front view
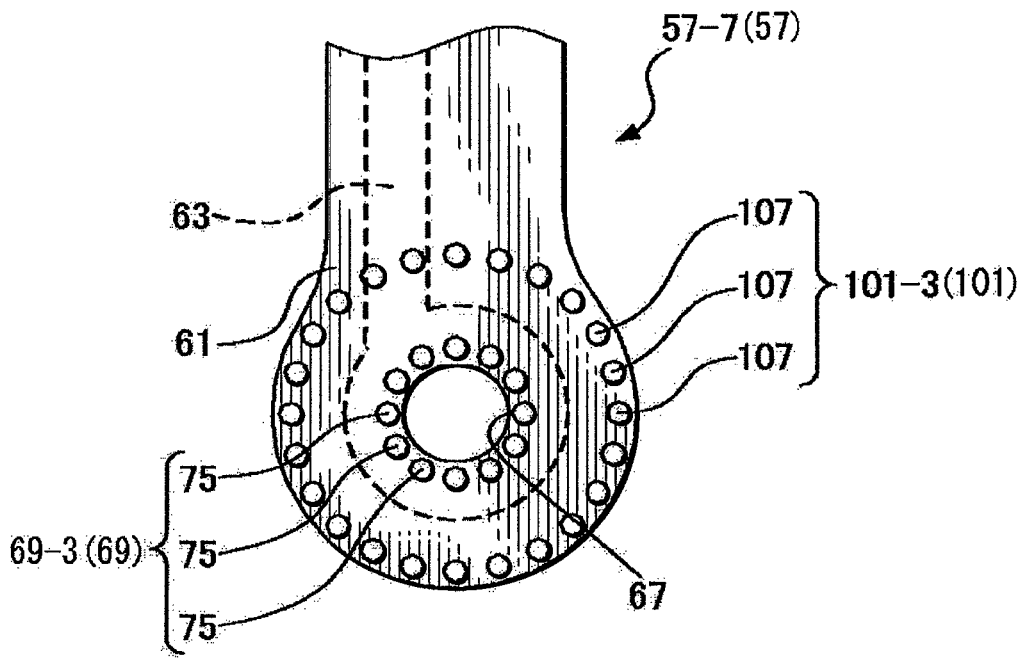
Fig.14(b) Sectional view of attached state
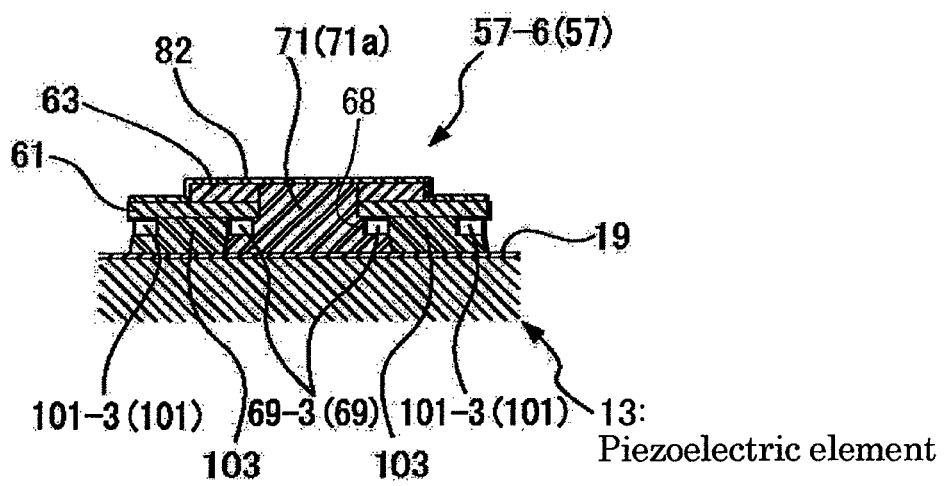

WIRING CONNECTING STRUCTURE FOR PIEZOELECTRIC ELEMENT, WIRING CONNECTING METHOD, PIEZOELECTRIC ACTUATOR, AND HEAD SUSPENSION

BACKGROUND OF THE INVENTION

1. Field of the Invention

The present invention relates to a wiring connecting structure for a piezoelectric element that warps according to a voltage applied state, a wiring connecting method, a piezoelectric actuator employing the piezoelectric element for driving an object, and a head suspension incorporating the piezoelectric actuator. In particular, the present invention relates to a wiring connecting structure for a piezoelectric element, capable of performing wiring to the piezoelectric element without deteriorating the quality and reliability thereof, a wiring connecting method for the wiring connecting structure, a piezoelectric actuator employing the piezoelectric element, and a head suspension employing the piezoelectric actuator.

2. Description of Related Art

Small-sized, precision information devices are rapidly advancing, and for use with such devices, needs for micro-actuators capable of conducting positioning control for very small distances are increasing. Such micro-actuators are highly needed by, for example, optical systems for correcting focuses and inclination angles, ink jet printers for controlling ink heads, and magnetic disk drives for controlling magnetic heads.

The magnetic disk drives are rapidly expanding market and improving performance, and accordingly, are strongly needed to increase storage capacities. Increasing the storage capacity of a magnetic disk drive is achievable by increasing the storage capacity of each magnetic disk contained in the magnetic disk drive.

The storage capacity or recording density of a magnetic disk will increase, without changing the diameter thereof, if the number of tracks per inch (TPI) on the magnetic disk is increased. For this, the width of each track on the magnetic disk must be narrowed. To handle such narrow tracks on the magnetic disk, a magnetic head of a head suspension installed in the magnetic disk drive must conduct a precise positioning operation in a direction across the tracks, i.e., a sway direction. For realizing the precise positioning operation, an actuator capable of accurately moving and positioning the magnetic head in a very small area is needed.

To meet the need, the applicant of the present invention has proposed in Japanese Unexamined Patent Application Publication No. 2002-50140 a head suspension for a disk drive, including a base plate, a connection plate having a hinge thinner than the base plate, a load beam provided with a flexure and a slider, and a piezoelectric actuator composed of a pair of piezoelectric elements.

This related art employs a dual actuator system that involves, for a precise positioning purpose, a voice coil motor and the piezoelectric actuator having two piezoelectric elements made of, for example, PZT (piezoelectric zirconate titanate). The piezoelectric actuator minutely drives a front end of the load beam or only the slider in a widthwise direction (sway direction) of the head suspension.

Compared with a single actuator system employing only a voice coil motor, the dual actuator system employing the voice coil motor and piezoelectric actuator more precisely positions a magnetic head attached to a front end of the head suspension.

An important issue for the head suspension employing the dual actuator system is how to supply electricity to the piezoelectric elements.

A technique to approach this issue is disclosed in Japanese Unexamined Patent Application Publication No. 2003-61371 (in particular, FIGS. 9 and 10 thereof). This related art arranges a pair of wires on a head suspension. One of the wires is connected through wire bonding to a base electrode and the other wire is connected through wire bonding to an exposed part of the top face of each piezoelectric element.

This related art has a risk of cracking the piezoelectric element because, to secure a bonding strength, it applies a local stress on the brittle piezoelectric element when bonding the wire to the piezoelectric element. If the wire bonding process is carried out with a reduced force not to crack the piezoelectric element, the bonding strength will be insufficient to deteriorate the reliability of electric connection to the piezoelectric element.

In this way, it is very difficult to carry out wiring to the piezoelectric element without damaging the same while securing the bonding strength.

SUMMARY OF THE INVENTION

An object of the present invention is to provide a wiring connecting structure for a piezoelectric element, capable of achieving wiring to the piezoelectric element without breaking the piezoelectric element or deteriorating the reliability thereof. Also provided are a wiring connecting method for the wiring connecting structure, a piezoelectric actuator employing the piezoelectric element, and a head suspension employing the piezoelectric actuator.

In order to accomplish the object, a first aspect of the present invention provides a wiring connecting structure for a piezoelectric element, the piezoelectric element being arranged between a base and head of an object, to minutely move the head in a sway direction according to deformation that occurs on the piezoelectric element in response to a voltage applied from a terminal to an electrode of the piezoelectric element. The wiring connecting structure includes first and second liquid stoppers arranged between the terminal and the electrode, the second liquid stopper being arranged outside the first liquid stopper, and an adhesive part configured to connect the electrode of the piezoelectric element to the terminal and having a conductive adhesive part defined by the first liquid stopper and a sealing adhesive part defined by the second liquid stopper and configured to seal the first liquid stopper and conductive adhesive part.

According to the first aspect, the conductive adhesive part is formed with the use of the first liquid stopper interposed between the electrode and the terminal. The first liquid stopper defines a narrowed gap that produces a capillary phenomenon to prevent the conductive adhesive part from expanding outside the first liquid stopper.

The second liquid stopper that is formed outside the first liquid stopper between the electrode and the terminal also defines a narrowed gap to prevent the sealing adhesive part from expanding outside the second liquid stopper. As a result, the sealing adhesive part surely prevents the conductive adhesive part from being exposed to the atmosphere.

In this way, the conductive adhesive part never expands out of the first liquid stopper. Namely, the first liquid stopper functions as a bank to surely confine the conductive adhesive part within the first liquid stopper. In consequence, the first aspect of the present invention secures electric connection between the electrode of the piezoelectric element and the terminal with a proper bonding strength without applying mechanical stress on the piezoelectric element.

The sealing adhesive part and second liquid stopper cooperate to prevent the conductive adhesive part from being exposed to the atmosphere, thereby preventing the conductive adhesive part from corroding. Even if the conductive adhesive part corrodes, it never leaks outside. Consequently, the first aspect of the present invention performs wiring to the piezoelectric element without deteriorating the quality and reliability of the piezoelectric element.

BRIEF DESCRIPTION OF THE DRAWINGS

FIGS. 5(a) and 5(b) are views illustrating a wiring member of the head suspension of FIG. 1 employing a basic wiring connecting structure of the present invention, in which FIG. 5(a) is a view seen from below the head suspension and FIG. 5(b) is a view seen from the piezoelectric element embedded in the head suspension;

FIGS. 6(a), 6(b), and 6(c) are views illustrating a first form of the basic wiring connecting structure, in which FIG. 6(a) is a front view, FIG. 6(b) is a right side view, and FIG. 6(c) is a sectional view taken along a line B-B of FIG. 4;

FIGS. 7(a) and 7(b) are views illustrating a second form of the basic wiring connecting structure, in which FIG. 7(a) is a front view and FIG. 7(b) is a sectional view taken along the line B-B of FIG. 4;

FIGS. 8(a) and 8(b) are views illustrating a third form of the basic wiring connecting structure, in which FIG. 8(a) is a front view and FIG. 8(b) is a sectional view taken along the line B-B of FIG. 4;

FIGS. 9(a), 9(b), and 9(c) are views illustrating a fourth form of the basic wiring connecting structure, in which FIG. 9(a) is a front view, FIG. 9(b) is a right side view, and FIG. 9(c) is a sectional view taken along the line B-B of FIG. 4;

FIGS. 10(a) and 10(b) are sectional views illustrating problems related to the first form of the basic wiring connecting structure;

FIGS. 11(a) and 11(b) are views illustrating a wiring connecting structure according to a first embodiment of the present invention, in which FIG. 11(a) is a front view and FIG. 11(b) is a sectional view taken along the line B-B of FIG. 4;

FIGS. 12(a) and 12(b) are views illustrating first and second wiring processes for the wiring connecting structure of FIGS. 11(a) and 11(b);

FIGS. 13(a) and 13(b) are views illustrating a wiring connecting structure according to a second embodiment of the present invention, in which FIG. 13(a) is a front view and FIG. 13(b) is a sectional view taken along the line B-B of FIG. 4;

FIGS. 14(a) and 14(b) are views illustrating a wiring connecting structure according to a third embodiment of the present invention, in which FIG. 14(a) is a front view and FIG. 14(b) is a sectional view taken along the line B-B of FIG. 4;

DETAILED DESCRIPTION OF EMBODIMENTS

The present invention performs wiring to a piezoelectric element without deteriorating the quality and reliability of the piezoelectric element or corroding a conductive adhesive part.

Wiring connecting structures for piezoelectric elements, wiring connecting methods for the wiring connecting structures, piezoelectric actuators employing piezoelectric elements, and head suspensions having piezoelectric actuators according to embodiments of the present invention will be explained in detail with reference to the drawings.

First, a head suspension 31 as an object according to an embodiment of the present invention will be explained.

Figure 1:
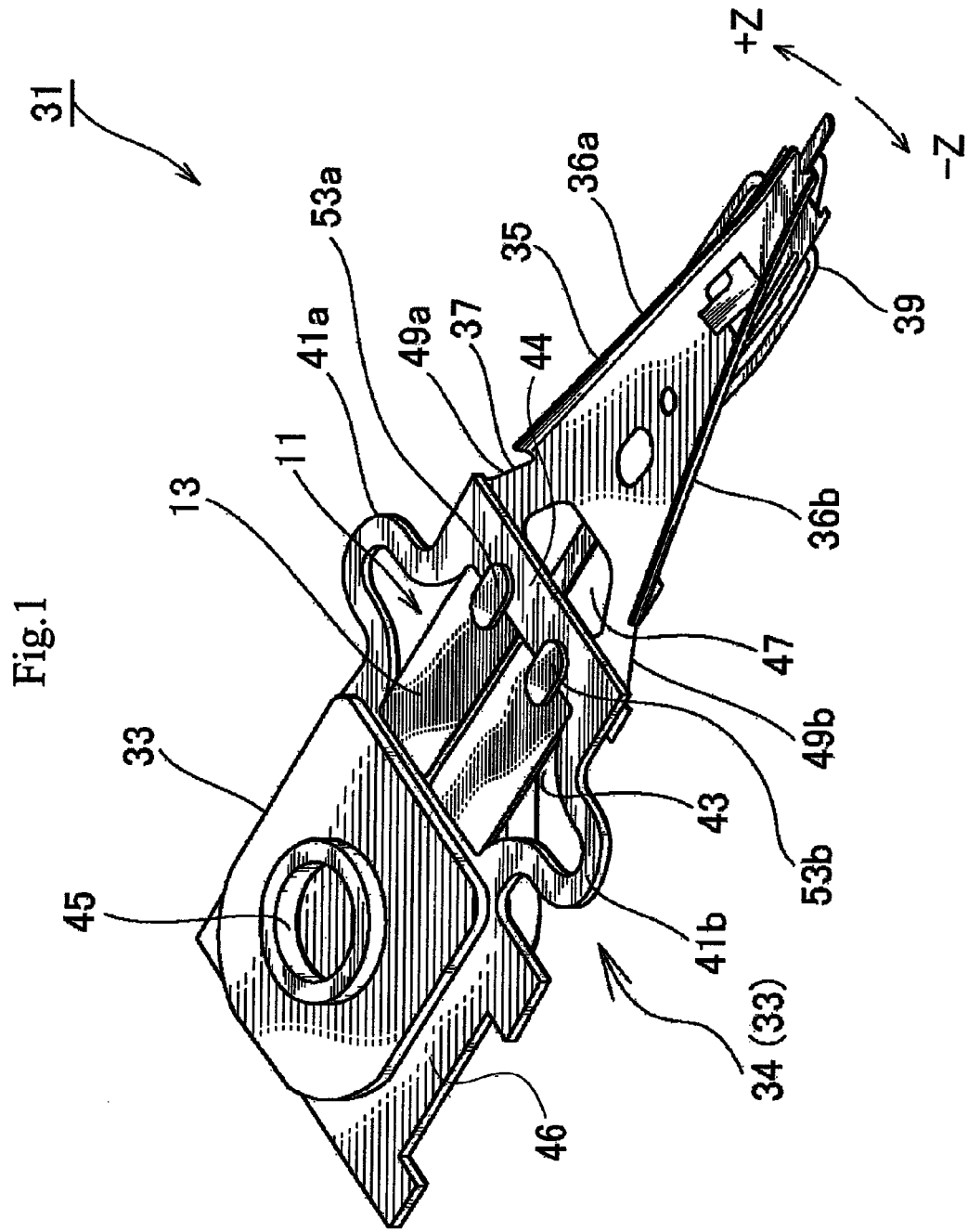
FIG. 1 is a perspective view illustrating a head suspension according to an embodiment of the present invention.

FIG. 1 is a perspective view illustrating the head suspension 31.

The head suspension 31 includes a base plate 33 to which a piezoelectric actuator 11 comprising a piezoelectric element 13 is attached, a load beam 35, a connection plate 37, and the like. The piezoelectric element 13 deforms in response to an applied voltage, to move a front end of the load beam 35 in sway directions (+Z and −Z directions indicated with arrows in FIG. 1), i.e., widthwise directions of the head suspension 31.

The base plate 33 is made of a metal plate such as a stainless steel plate having a thickness of about 150 to 200 μm. The base plate 33 may be made of light metal such as aluminum alloy or a clad material comprising light metal and stainless steel. Such a light material may reduce the inertia of the base plate 33, increase the resonant frequency of the head suspension 31 in the sway directions, and improve the tracing performance of the head suspension 31.

The base plate 33 has a boss 45 that is substantially circular. The base plate 33 is fixed through the boss 45 to a front end of an actuator arm (not illustrated) that is driven and turned by a voice coil motor (not illustrated).

The base plate 33 also functions as an attaching part of the piezoelectric element 13. Namely, the base plate 33 has an actuator plate 34 extending toward a front end of the head suspension 31. The actuator plate 34 has an opening 43 between a front end 44 thereof and a rear end 46 thereof, to accommodate the piezoelectric element 13. The actuator plate 34 includes a pair of flexible parts 41a and 41b each having a U-shape. The flexible parts 41a and 41b each are outwardly curved at a location corresponding to a side face of the piezoelectric element 13.

The actuator plate 34 and base plate 33 may be integral with each other or may be discrete parts. If they are discrete, a rear end 46 of the actuator plate 34 is laid on the base plate 33 and is fixed thereto by proper fixing means such as laser welding. Instead, the actuator plate 34 may be omitted and the flexible parts 41a and 41b and opening 43 may directly be formed on the base plate 33.

Namely, the present invention covers not only a head suspension having both the base plate 33 and actuator plate 34 that are integral with each other or are discrete parts but also a head suspension having only the base plate 33 and no actuator plate 34. In the following explanation, the actuator plate 34 is considered to be integral with the base plate 33, for the sake of simplicity of explanation.

The load beam 35 has a flexure 39. The flexure 39 is made of a metal thin plate spring that is thinner and more precise than the load beam 35. A front end of the flexure 39 is provided with a slider (not illustrated) having a magnetic head. The load beam 35 is made of a stainless steel plate having a thickness of about 30 to 150 μm and is designed to apply load onto the slider.

The load beam 35 has longitudinal bent edges 36a and 36b to improve the rigidity of the load beam 35. A rear end of the load beam 35 is integral with the connection plate 37.

The load beam 35 may be made of light metal such as aluminum alloy or a clad material comprising light metal and stainless steel. Such a light material may reduce the inertia of the load beam 35, increase the resonant frequency of the head suspension 31 in the sway directions, and improve the tracing performance of the head suspension 31.

The connection plate 37 is made of a resilient metal plate having a thickness of about 30 μm and functioning as a hinge. A middle portion of the connection plate 37 has a hole 47 to reduce rigidity in a thickness direction. On each side of the hole 47, there are hinges 49a and 49b that bend in the thickness direction. A rear end of the connection plate 37 is laid on the bottom face of the front end 44 of the actuator plate 34 and is fixed thereto by proper fixing means such as laser welding.

The piezoelectric element 13 deforms according to a voltage applied state. The piezoelectric element 13 is embedded in the opening 43 of the base plate 33, to constitute the piezoelectric actuator 11.

Figure 2:
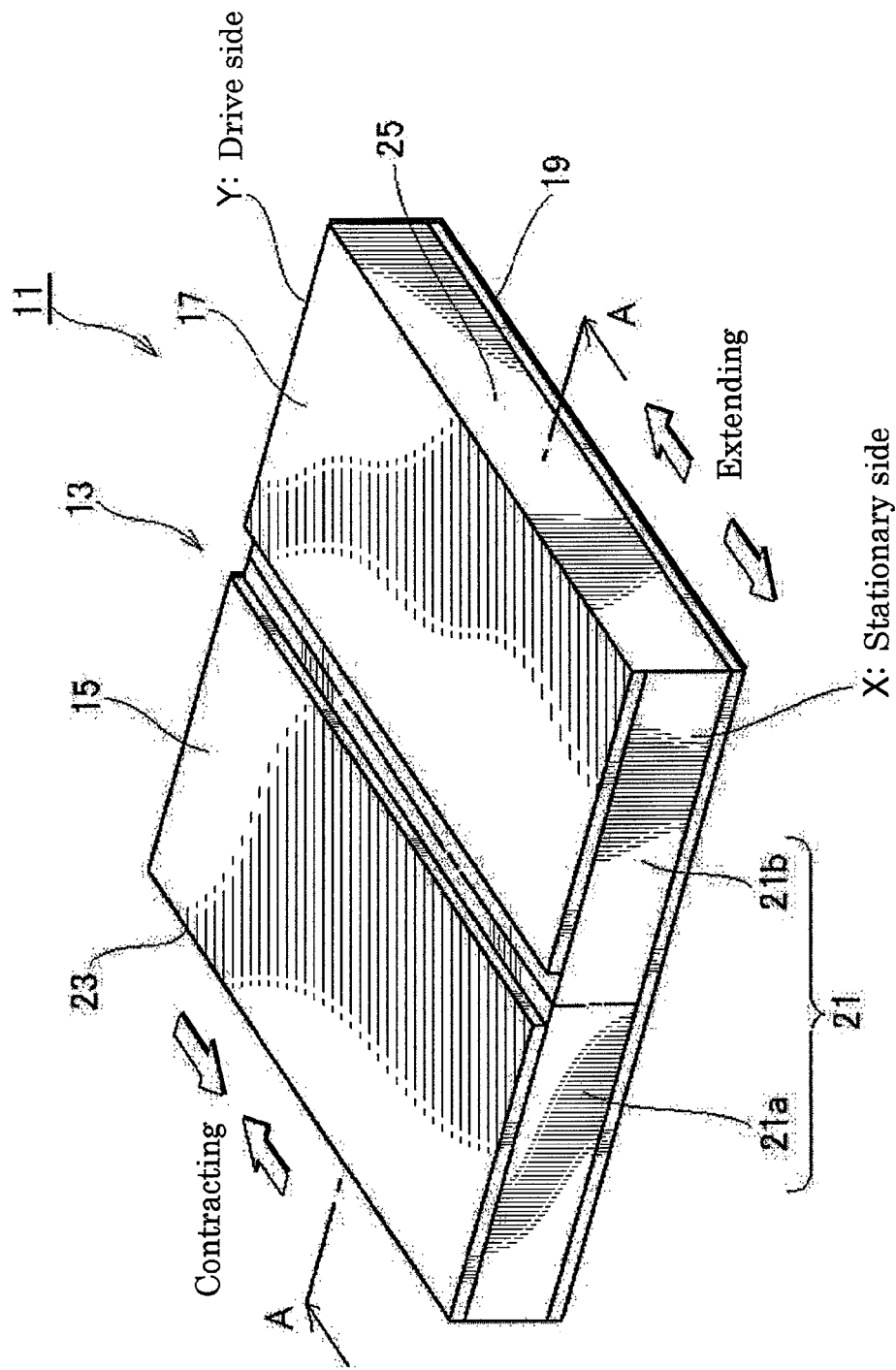
FIG. 2 is a perspective view illustrating a piezoelectric actuator employed by the head suspension of FIG. 1.
Figure 3:
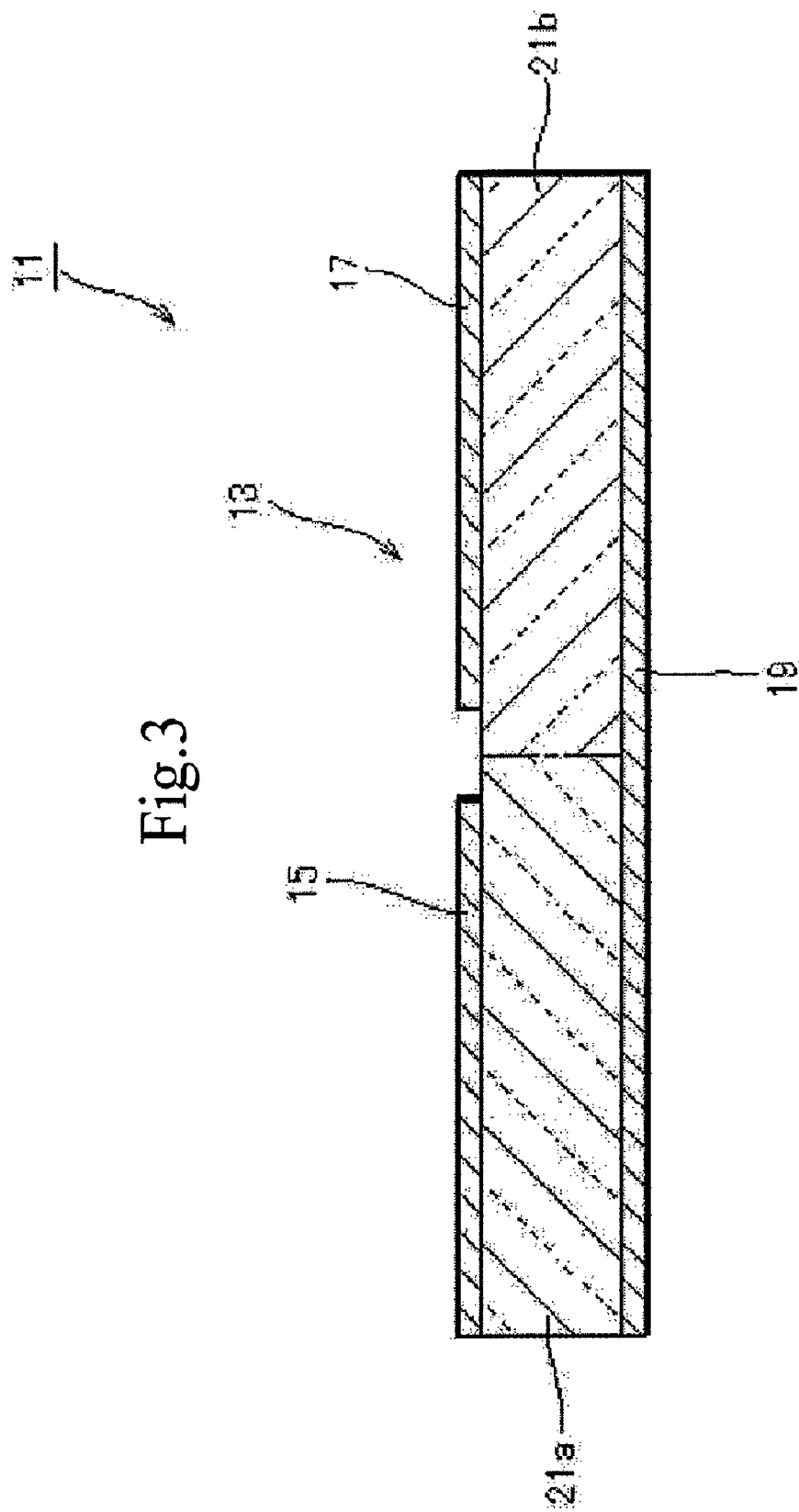
FIG. 3 is a sectional view taken along a line A-A of FIG. 2.

FIG. 2 is a perspective view illustrating the piezoelectric actuator 11 and FIG. 3 is a sectional view taken along a line A-A of FIG. 2.

In FIGS. 2 and 3, the piezoelectric actuator 11 comprises the piezoelectric element 13 substantially having a rectangular shape. The piezoelectric element 13 deforms in response to an applied voltage, to drive an objective part (the load beam 35). Deformation of the piezoelectric element 13 occurs when a voltage is applied thereto, or when the voltage applied thereto is stopped, or according to the level of a voltage applied thereto.

The piezoelectric element 13 includes first and second electrodes 15 and 17 that form a pair, a common electrode 19, and a piezoelectric material portion 21.

The first and second electrodes 15 and 17 are arranged in a common plane on a surface of the piezoelectric element 13 and are separated from each other by a predetermined distance. The common electrode 19 is arranged on another surface of the piezoelectric element 13 that is opposite to the surface on which the first and second electrodes 15 and 17 are arranged.

The first and second electrodes 15 and 17 and common electrode 19 may be made of metal having a low contact resistance, such as gold (Au). The first and second electrodes 15 and 17 substantially have the same shape and size. The common electrode 19 is substantially equal in size and shape to a combination of the first and second electrodes 15 and 17 and the space between the electrodes 15 and 17.

The piezoelectric material portion 21 is arranged between the first and second electrodes 15 and 17 and the common electrode 19 and comprises a first piezoelectric material portion 21a that deforms according to a voltage applied to the first electrode 15 and a second piezoelectric material portion 21b that deforms according to a voltage applied to the second electrode 17. The first and second piezoelectric material portions 21a and 21b are arranged adjacent to each other and are processed so that they are oppositely polarized. The first and second piezoelectric material portions 21a and 21b are made of, for example, piezoelectric ceramics that are polarized with a polarization direction difference of 180 degrees.

Operation of the piezoelectric actuator 11 will be explained. In FIG. 2, a side of the piezoelectric element 13 marked with "X" is a stationary side, a side marked with "Y" is a drive side, the first and second electrodes 15 and 17 are grounded, and the common electrode 19 receives an applied voltage.

Receiving the voltage, the piezoelectric element 13 deforms into a trapezoid with an end face 23 disposed on the first electrode side contracting and an end face 25 disposed on the second electrode side extending. As a result, the piezoelectric element 13 moves a very small distance in the direction Z (FIG. 2), to thereby move a part (the load beam 35) attached to the drive side Y of the piezoelectric element 13.

When the common electrode 19 is grounded and the first and second electrodes 15 and 17 receive a voltage, the piezoelectric element 13 moves a minute distance in the direction −Z (opposite to the direction Z of FIG. 2), to thereby move the part (load beam 35) attached to the drive side Y of the piezoelectric element 13.

The piezoelectric actuator 11 needs three electric systems for the first and second electrodes 15 and 17 and common electrode 19. This configuration simplifies wiring to the piezoelectric element 13 and secures the reliability thereof.

The piezoelectric actuator 11 has only one piezoelectric element 13, to reduce the number of parts, minimize parts management, and reduce the cost of the head suspension 31.

Figure 4:
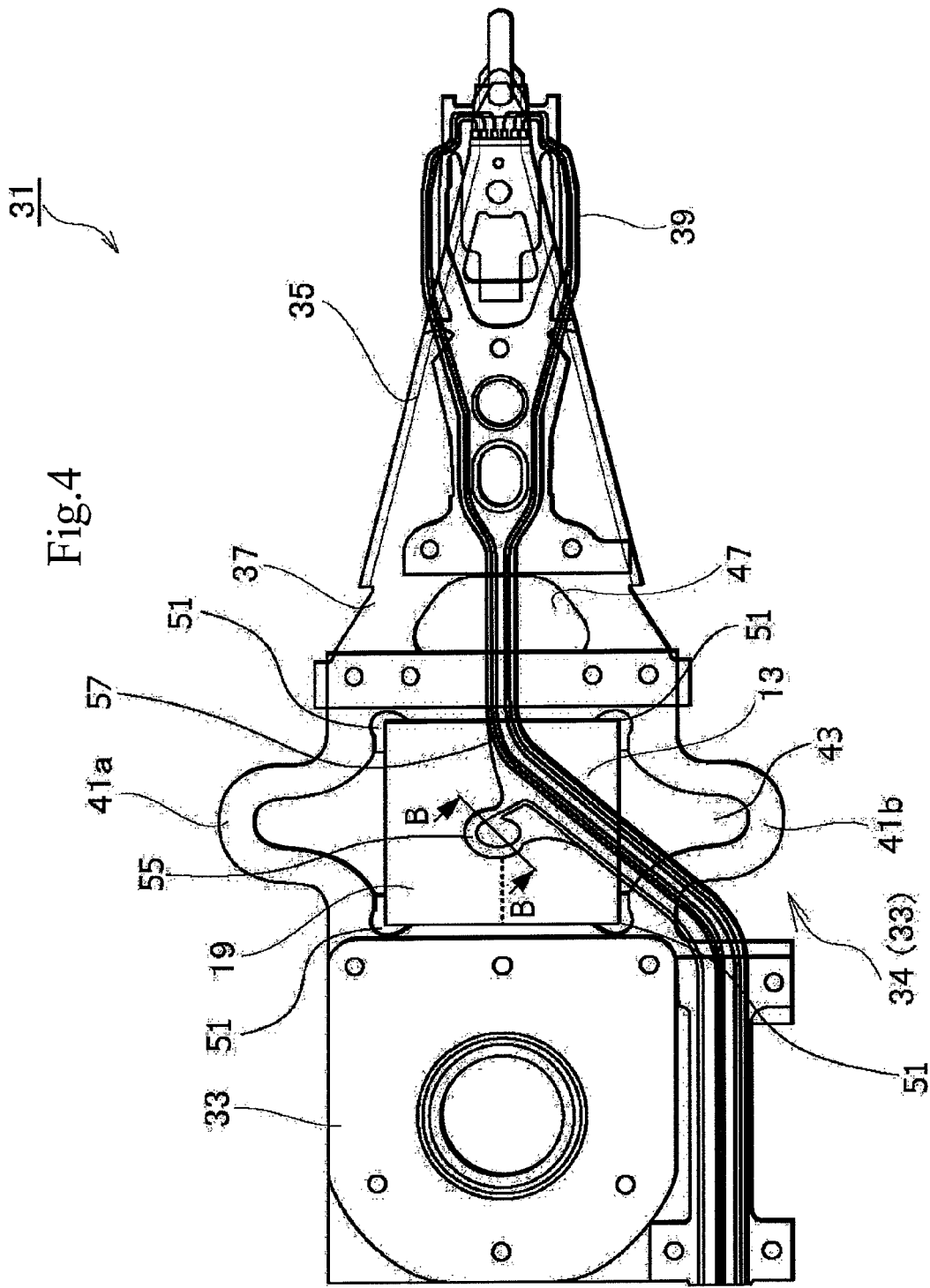
FIG. 4 is a bottom view illustrating the head suspension of FIG. 1; stoic

FIG. 4 is a back view illustrating the head suspension 31.

In FIGS. 1 to 4, the opening 43 of the actuator plate 34 accommodates the piezoelectric element 13 with the first and second electrodes 15 and 17 being on top and the common electrode 19 being at the bottom.

Front and rear ends 44 and 46 of the actuator plate 34 are partly etched along the opening 43 to improve adhesiveness between the opening 43 and the piezoelectric element 13. On the opposite side of the flexure 39, i.e., on the opposite side of a disk, conductive adhesives 53a and 53b are applied between the front end 44 of the actuator plate 34 and the first and second electrodes 15 and 17 of the piezoelectric element 13, as illustrated in FIG. 1. Through the conductive adhesives 53a and 53b, the first and second electrodes 15 and 17 are electrically connected to the actuator plate 34. The common electrode 19 is connected through a wiring connecting structure (to be explained later) to a terminal 57 of the flexure 39.

Between the piezoelectric element 13 and an inner circumferential edge of the opening 43, there is a nonconductive adhesive layer 51 having a proper thickness. The adhesive layer 51 effectively transfers a deformation (displacement) of the piezoelectric element 13 to the load beam 35 and secures electric insulation between the common electrode 19 of the piezoelectric element 13 and the base plate 33. A part where the actuator plate 34 of the base plate 33 overlaps the connection plate 37 corresponds to the drive side Y of the piezoelectric actuator 11.

Before explaining wiring connecting structures and wiring connecting methods for the piezoelectric element 13 according to embodiments of the present invention, a basic wiring connecting structure and several forms thereof on which the present invention is based will be explained.

FIGS. 5(a) and 5(b) are views illustrating the details of a wiring member 55 of the flexure 39 of the head suspension 31 of FIG. 1 employing the basic wiring connecting structure, in which FIG. 5(a) is a view seen from below the head suspension 31 and FIG. 5(b) is a view seen from the piezoelectric element 13 embedded in the head suspension 31.

When assembling the head suspension 31, the piezoelectric element 13 is positioned with respect to an inner circumferential face of the opening 43. As a result, the central part of the common electrode 19 of the piezoelectric element 13 faces the terminal 57 of the flexure 39 as illustrated in FIGS. 4, 5(a), and 5(b). The terminal 57 is used to apply a voltage to the piezoelectric element 13. The terminal 57 is annular and is formed on the wiring member 55 of the flexure 39. Between the terminal 57 and the common electrode 19, there is a gap of several tens of micrometers.

The wiring member 55 is arranged on the head suspension 31 through the flexure 39 to supply electricity to the piezoelectric element 13 and transmit read/write signals to and from the magnetic head of the head suspension 31. As illustrated in FIG. 5(a), the wiring member 55 has a three-layer structure including a conductive base 59 (an SUS base of the flexure 39), an electric insulating layer 61 formed on the conductive base 59, and the wiring 63 made of, for example, copper wires arranged on the insulating layer 61. The wiring 63 is connected to the terminal 57.

As illustrated in FIG. 5(b), an area 65 of the wiring member 55 that faces the common electrode 19 of the piezoelectric element 13 has no conductive base. Namely, in the area 65, the conductive base 59 is partly removed by etching and the terminal 57 is left in the area 65 in such a way as to prevent a short-circuit failure between the common electrode 19 and the remaining part of the conductive base 59 of the flexure 39. The terminal 57, therefore, has the electric insulating layer 61 and the wiring 63 formed on the insulating layer 61.

The terminal 57 is connected to the common electrode 19 of the piezoelectric element 13 through the wiring connecting structure.

FIGS. 6(a) to 9(c) show basic wiring connecting structures applied to wiring connecting structures according to embodiments.

As shown in FIGS. 6(a) to 9(c), the basic wiring connecting structure includes a conductive adhesive part 71a to fill a gap between the terminal 57 of the flexure 39 and the common electrode 19 of the piezoelectric element 13 and electrically connect the terminal 57 and common electrode 19 to each other.

The terminal 57 of the flexure 39 has a through hole 67 formed through the electric insulating layer 61 and wiring 63. The terminal 57 is arranged so that the insulating layer 61 faces the piezoelectric element 13. The wiring 63 of the terminal 57 is exposed toward the piezoelectric element 13 through the through hole 67. Between the terminal 57 and the common electrode 19, a first liquid stopper 69 is arranged around the through hole 67. The conductive adhesive 71 in a liquid state is filled in the through hole 67 of the terminal 57 and is hardened.

According to the basic wiring connecting structure, the first liquid stopper 69 is arranged between the terminal 57 of the flexure 39 and the common electrode 19 of the piezoelectric element 13, and the conductive adhesive part 71a is inside the first liquid stopper 69.

The conductive adhesive part 71a in the through hole 67 electrically connects the wiring 57 of the terminal 57 to the common electrode 19 of the piezoelectric element 13.

The first liquid stopper 69 narrows the gap between the common electrode 19 and the terminal 57 to produce a capillary phenomenon at the narrowed gap when the conductive adhesive 71 in a liquid state is injected into the through hole 67.

The first liquid stopper 69 must be a solid obstacle against the liquid conductive adhesive 71, and therefore, is made of a proper material such as metal or resin that is not corroded or dissolved by the adhesive 71. The conductive adhesive 71 may be any proper adhesive such as a silver paste.

Various forms of the basic wiring connecting structure of the present invention will be explained with reference to FIGS. 6(a) to 9(c).

FIGS. 6(a), 6(b), and 6(c) illustrate a first form of the basic wiring connecting structure, in which FIG. 6(a) is a front view, FIG. 6(b) is a right side view, and FIG. 6(c) is a sectional view taken along a line B-B of FIG. 4.

The first form of the basic wiring connecting structure includes a terminal 57-1, a through hole 67 formed in the terminal 57-1, and a first liquid stopper 69-1 that is annular and surrounds the through hole 67. The first liquid stopper 69-1 protrudes from the electric insulating layer 61 toward the common electrode 19 of the piezoelectric element 13. The first liquid stopper 69-1 has a hole 68 communicating with the through hole 67. The diameter of the hole 68 is larger than that of the through hole 67.

The annular first liquid stopper 69-1 is formed by leaving a part of the conductive base 59 of the wiring member 55 around the through hole 67 when etching off the conductive base 59 in the area 65 (FIG. 5(b)). At this time, the first liquid stopper 69-1 must completely be insulated from the conductive base 59 that is present outside the area 65, to prevent a short-circuit failure between the common electrode 19 and the conductive base 59.

Instead of partly using the conductive base 59, the annular first liquid stopper 69-1 may be made as a discrete part that is separate from the conductive base 59 (terminal 57-1). In this case, the conductive base 59 in the area 65 is completely etched off, and then, the annular first liquid stopper 69-1 is attached to the electric insulating layer 61.

Between the terminal 57-1 and the common electrode 19, the first liquid stopper 69-1 is arranged on the terminal 57-1. The through hole 67 of the terminal 57-1 is present inside the first liquid stopper 69-1 and is filled with a conductive adhesive 71 that is liquid when filled and is then hardened to form a conductive adhesive part 71a. The conductive adhesive part 71a electrically connects the wiring 63 in the through hole 67 of the terminal 57-1 to the common electrode 19 of the piezoelectric element 13.

FIGS. 7(a) and 7(b) illustrate a second form of the basic wiring connecting structure, in which FIG. 7(a) is a front view and FIG. 7(b) is a sectional view taken along the line B-B of FIG. 4.

The second form of the basic wiring connecting structure employs a terminal 57-2. The terminal 57-2 includes a first liquid stopper 69-2 comprising a group of discrete segments 73 that are circumferentially arranged around a through hole 67 of the terminal 57-2.

In FIG. 7(a), the first liquid stopper 69-2 includes four discrete segments 73 that surround the through hole 67 at equal intervals. Each discrete segment 73 substantially has a trapezoidal shape.

The first liquid stopper 69-2 may be formed by circumferentially separating the first liquid stopper 69-1 of the terminal 57-1 (FIG. 6(a)) with cuts 74. The first liquid stopper 69-2 may be formed by leaving parts of the conductive base 59 around the through hole 67 when etching off the conductive base 59 in the area 65 (FIG. 5(b)).

Between the terminal 57-2 and the common electrode 19, the first liquid stopper 69-2 is on the terminal 57-2. The through hole 67 of the terminal 57-2 is inside the first liquid stopper 69-2 and is filled with a conductive adhesive 71 that is liquid when filled and is then hardened to form a conductive adhesive part 71a. The conductive adhesive part 71a electrically connects wiring 63 of the terminal 57-2 to the common electrode 19 of the piezoelectric element 13.

FIGS. 8(a) and 8(b) illustrate a third form of the basic wiring connecting structure, in which FIG. 8(a) is a front view and FIG. 8(b) is a sectional view taken along the line B-B of FIG. 4.

The third form of the basic wiring connecting structure employs a terminal 57-3. The terminal 57-3 includes a first liquid stopper 69-3 comprising a group of discrete segments 75 each having a cylindrical shape.

In FIG. 8(a), the first liquid stopper 69-3 includes four discrete segments 75 that surround a through hole 67 of the terminal 57-3 at equal intervals.

The first liquid stopper 69-3 may be formed by leaving parts of the conductive base 59 around the through hole 67 when etching off the conductive base 59 in the area 65 (FIG. 5(b)).

Between the terminal 57-3 and the common electrode 19, the first liquid stopper 69-3 is on the terminal 57-3. The through hole 67 of the terminal 57-3 is inside the first liquid stopper 69-3 and is filled with a conductive adhesive 71 that is liquid when filled and is then hardened to form a conductive adhesive part 71a. The conductive adhesive part 71a electrically connects the wiring 63 of the terminal 57-3 to the common electrode 19 of the piezoelectric element 13.

FIGS. 9(a), 9(b), and 9(c) illustrate a fourth form of the basic wiring connecting structure, in which FIG. 9(a) is a front view, FIG. 9(b) is a right side view, and FIG. 9(c) is a sectional view taken along the line B-B of FIG. 4.

The fourth form of the basic wiring connecting structure employs a terminal 57-4. The terminal 57-4 includes a first liquid stopper 69-4 that is arranged on the piezoelectric element 13.

The first liquid stopper 69-4 is annular and is attached to the common electrode 19 of the piezoelectric element 13. Namely, the first liquid stopper 69-4 protrudes from the common electrode 19 toward the terminal 57-4.

Between the terminal 57-4 and the common electrode 19, the first liquid stopper 69-4 is on the common electrode 19. A through hole 67 of the terminal 57-4 is inside the first liquid stopper 69-4 and is filled with a conductive adhesive 71 that is liquid when filled and is then hardened to form a conductive adhesive part 71a. The conductive adhesive part 71a electrically connects the wiring 63 of the terminal 57-4 to the common electrode 19 of the piezoelectric element 13.

According to the basic wiring connecting structure, the first liquid stopper 69 is present between the common electrode 19 and the terminal 57, to define a narrowed gap in a gap between the common electrode 19 and the terminal 57. The narrowed gap causes a capillary phenomenon when the conductive adhesive 71 in a liquid state is injected into the through hole 67, and therefore, the conductive adhesive 71 diffuses from the inside of the first liquid stopper 69 into the narrowed gap.

The gap between the terminal 57 and the common electrode 19 out of the first liquid stopper 69 is wider than the narrowed gap, and therefore, causes no capillary phenomenon so that the conductive adhesive 71 does not ooze outside the first liquid stopper 69.

Namely, the conductive adhesive 71 does not spread over an outer edge of the first liquid stopper 69. The outer edge of the first liquid stopper 69 functions as a bank to keep the adhesive 71 within the outer edge of the first liquid stopper 69 and harden the adhesive 71 at there. As a result, the common electrode 19 of the piezoelectric element 13 and the wiring 63 of the terminal 57 are firmly joined together without applying mechanical stress onto the piezoelectric element 13 and the common electrode 19 and wiring 63 are surely electrically connected to each other.

The basic wiring connecting structure, therefore, allows wiring to the piezoelectric element 13 to be carried out without deteriorating the quality and reliability of the piezoelectric element 13.

If the first liquid stopper 69 is not present in the gap between the common electrode 19 and the terminal 57, there will be no means functioning as a bank to stop the conductive adhesive 71.

Then, the conductive adhesive 71 injected in a liquid state into the through hole 67 freely penetrates into the gap between the common electrode 19 and the terminal 57.

Then, it will be difficult to control the amount of the liquid conductive adhesive 71 to be injected into the through hole 67, or to automate the injecting work of the adhesive 71 into the through hole 67. Also, the rigidity balance and vibration characteristic of the head suspension 31 will be destabilized. If the adhesive 71 excessively spreads, a short circuit will occur between the electrode 19 and an adjacent conductive part.

On the other hand, the basic wiring connecting structure arranges the first liquid stopper 69 between the common electrode 19 and the terminal 57 to limit the periphery of the conductive adhesive 71 and prevent the liquid conductive adhesive 71 from freely spreading.

Namely, the basic wiring connecting structure solves the above-mentioned problems and is capable of controlling the amount of the liquid conductive adhesive 71 to be injected into the through hole 67, automating the injecting work of the liquid conductive adhesive 71 into the through hole 67, properly securing the rigidity balance and vibration characteristic of the head suspension 31, and properly restricting the liquid conductive adhesive 71, to prevent a short circuit between the common electrode 19 and an adjacent conductive part.

According to the first form of the basic wiring connecting structure employing the terminal 57-1, the annular first liquid stopper 69-1 forms an annular narrowed gap around the through hole 67 between the terminal 57-1 and the common electrode 19 as illustrated in FIG. 6(c).

The liquid conductive adhesive 71 does not run over the outer edge of the first liquid stopper 69-1. The adhesive 71 stays within the annular outer edge of the first liquid stopper 69-1 and hardens therein. As a result, electric connection between the wiring 63 of the terminal 57-1 and the common electrode 19 of the piezoelectric element 13 is secured with a proper bonding strength without mechanical stress on the piezoelectric element 13.

The first form of the basic wiring connecting structure, therefore, realizes wiring to the piezoelectric element 13 without deteriorating the quality and reliability of the piezoelectric element 13.

According to the second (third) form of the basic wiring connecting structure employing the terminal 57-2 (57-3), the first liquid stopper 69-2 (69-3) comprising discrete segments 73 (75) around the through hole 67 forms the narrowed gap (FIGS. 7(b) and 8(b)) between the common electrode 19 and the terminal 57-2 (57-3).

Namely, between the common electrode 19 and the terminal 57-2 (57-3) and between the segments 73 (75), narrowed gaps of different shapes are formed. Each of the narrowed gaps causes a capillary phenomenon to diffuse the adhesive 71 in the narrowed gap.

The adhesive 71 does not run over the periphery (indicated with a dotted line 79 in FIGS. 7(a) and 8(a)) of the first liquid stopper 69-2 (69-3). The periphery of the first liquid stopper 69-2 (69-3) keeps and hardens the adhesive 71 within there, thereby securing a bonding strength and electric connection between the common electrode 19 of the piezoelectric element 13 and the wiring 63 of the terminal 57-2 (57-3).

The second (third) form of the basic wiring connecting structure employing the terminal 57-2 (57-3), therefore, realizes wiring to the piezoelectric element 13 without deteriorating the quality and reliability of the piezoelectric element 13.

According to the fourth form of the basic wiring connecting structure employing the terminal 57-4, the annular first liquid stopper 69-4 attached to the common electrode 19 of the piezoelectric element 13 forms an annular narrowed gap around the through hole 67 between the terminal 57-4 and the common electrode 19 as illustrated in FIG. 9(c).

The liquid conductive adhesive 71 does not run over the outer edge of the first liquid stopper 69-4. The adhesive 71 stays within the annular outer edge of the first liquid stopper 69-4 and hardens therein. As a result, electric connection between the wiring 63 of the terminal 57-4 and the common electrode 19 of the piezoelectric element 13 is secured with a more proper bonding strength without mechanical stress on the piezoelectric element 13.

This improves the reliability of wiring to the piezoelectric element 13.

FIGS. 10(a) and 10(b) are sectional views illustrating problems related to the first form of the basic wiring connecting structure.

In FIG. 10(a), the first form of the wiring connecting structure employing the terminal 57-1 exposes the conductive adhesive part 71a to the atmosphere at the top of the through hole 67 and at the narrowed gap defined by the first liquid stopper 69-1 between the terminal 57-1 and the common electrode 19.

Generally, a conductive adhesive deteriorates due to oxidation if exposed to the atmosphere, in particular, oxygen for a long time.

To prevent the oxidation of the conductive adhesive part 71a, the wiring 63 of the terminal 57-1 may be covered with a covering layer 82 as illustrated in FIG. 10(b). The covering layer 82 closes the top of the through hole 67 and prevents the formation of a bulge 80 (FIG. 10(a)) of the conductive adhesive part 71a and the exposure to the atmosphere of the conductive adhesive part 71a. This, however, is unable to reduce the risk of oxidation of the conductive adhesive part 71a at the narrowed part between the terminal 57-1 and the common electrode 19.

To solve the problem, the wiring connecting structures according to the embodiments illustrated in FIGS. 11(a) to 15 each employ, in addition to the above-mentioned basic wiring connecting structure, a second liquid stopper 101 and a sealing adhesive part 103a.

FIGS. 11(a) to 15 show wiring connecting structures according to embodiments.

The second liquid stopper 101 is arranged outside the first liquid stopper 69 between the terminal 57 and the common electrode 19. A liquid sealing adhesive 103 is filled within the periphery of the second liquid stopper 101 and is hardened at there to form the sealing adhesive part 103a.

Namely, the sealing adhesive part 103a is formed within the periphery of the second liquid stopper 101, to seal around the first liquid stopper 69. The sealing adhesive part 103a physically prevents the conductive adhesive part 71a from being exposed to the atmosphere, thereby preventing the oxidation and corrosion of the conductive adhesive part 71a between the terminal 57 and the common electrode 19.

The second liquid stopper 101 is present between the terminal 57 and the common electrode 19, to define a narrowed gap between the terminal 57 and the common electrode 19. The narrowed gap causes a capillary phenomenon of the sealing adhesive 103 filled around the first liquid stopper 69.

The second liquid stopper 101 is made of a proper material such as metal and resin so that the second liquid stopper 101 may serve as a solid obstacle against the sealing adhesive 103 and demonstrate an affinity for adjacent materials not to corrode or dissolve the adjacent materials.

The top of the through hole 67 of the terminal 57 is closed with a covering layer 82.

The wiring connecting structures according to the embodiments of the present invention will be explained in detail.

FIGS. 11(a) and 11(b) illustrate a wiring connecting structure according to the first embodiment of the present invention, in which FIG. 11(a) is a front view and FIG. 11(b) is a sectional view taken along the line B-B of FIG. 4.

The wiring connecting structure according to the first embodiment employs a terminal 57-5 having an annular second liquid stopper 101-1 in addition to the first form of the basic wiring connecting structure employing the terminal 57-1.

Between the terminal 57-5 and the common electrode 19, a first liquid stopper 69-1 and the second liquid stopper 101-1 are arranged. The second liquid stopper 101-1 is outside the first liquid stopper 69-1 and protrudes from an electric insulating layer 61 of the terminal 57-5 toward the common electrode 19 of the piezoelectric element 13.

The second liquid stopper 101-1 surrounds the first liquid stopper 69-1 and is spaced therefrom. Namely, an annular recess is defined between the first and second liquid stoppers 69-1 and 101-1.

Into this annular recess as the inside of the second liquid stopper 101-1, a liquid sealing adhesive 103 is filled and is hardened at there, to form a sealing adhesive part 103a that physically prevents the conductive adhesive part 71a from being exposed to the atmosphere.

In this way, the second liquid stopper 101-1 and sealing adhesive part 103a cooperate to physically prevent the conductive adhesive part 71a from being exposed to the atmosphere and from being corroded. Even if the conductive adhesive part 71a is corroded, the conductive adhesive never leaks outside.

FIGS. 12(a) and 12(b) illustrate first and second wiring processes for the wiring connecting structure of FIGS. 11(a) and 11(b).

To attach the terminal 57-5 to the piezoelectric element 13, the terminal 57-5 is inverted so that the opening of the through hole 67 of the terminal 57-5 is on top. A liquid conductive adhesive 71 is filled in the through hole 67 that is inside the first liquid stopper 69-1, and a liquid sealing adhesive 103 is filled within the second liquid stopper 101-1 so that the sealing adhesive 103 fills the annular recess between the first and second liquid stoppers 69-1 and 101-1.

Thereafter, the terminal 57-5 is inverted to an original state so that the electric insulating layer 61 of the terminal 57-5 faces the piezoelectric element 13 as illustrated in FIG. 12(a). Then, the terminal 57-5 is brought in contact with the common electrode 19 of the piezoelectric element 13 as illustrated in FIG. 12(b).

As a result, the first and second liquid stoppers 69-1 and 101-1 are positioned between the terminal 57-5 of the flexure 39 and the common electrode 19 of the piezoelectric element 13. The first liquid stopper 69-1 prevents the conductive adhesive 71 from spreading outward and the second liquid stopper 101-1 prevents the sealing adhesive 103 from spreading outward.

The conductive adhesive 71 and sealing adhesive 103 harden to form the conductive adhesive part 71a and sealing adhesive part 103a as an adhesive part to join the terminal 57-5 of the flexure 39 and the common electrode 19 of the piezoelectric element 13 together.

The conductive adhesive part 71a is within the first liquid stopper 69-1, to electrically connect the common electrode 19 and the wiring 63 of the terminal 57-5 to each other. A covering layer 82 is formed to prevent the top of the conductive adhesive part 71a in the through hole 67 from being exposed to the atmosphere.

The sealing adhesive 103 defined by the second liquid stopper 101-1 seals the periphery of the conductive adhesive part 71a.

In this way, the sealing adhesive part 103a cooperates with the second liquid stopper 101-1, to prevent the conductive adhesive part 71a from being exposed through the narrowed part on the first liquid stopper 69-1 to the atmosphere.

In the state illustrated in FIG. 12(b), the sealing adhesive 103 may temporarily be hardened by irradiating the same with ultraviolet rays, and thereafter, the conductive adhesive 71 and sealing adhesive 103 may fully be hardened by heat-treating the adhesives 71 and 103. This technique effectively prevents the adhesives 71 and 103 from oozing out.

FIGS. 13(a) and 13(b) illustrate a wiring connecting structure according to the second embodiment of the present invention, in which FIG. 13(a) is a front view and FIG. 13(b) is a sectional view taken along the line B-B of FIG. 4.

The wiring connecting structure according to the second embodiment employs a terminal 57-6 having a first liquid stopper 69-2 comprising circumferentially-arranged discrete segments 73 and a second liquid stopper 101-2 comprising circumferentially-arranged discrete segments 105.

More precisely, the first liquid stopper 69-2 has 12 discrete segments 73 surrounding a through hole 67 of the terminal 57-6 at equal intervals. Each discrete segment 73 substantially has a trapezoidal shape. The first liquid stopper 69-2 is formed by circumferentially separating the annular first liquid stopper 69-1 of the terminal 57-5 (FIG. 11(a)) with cuts 74.

The second liquid stopper 101-2 has 12 discrete segments 105 surrounding the first liquid stopper 69-2 at equal intervals. The discrete segments 105 are formed by circumferentially separating the annular liquid stopper 101-1 (FIG. 11(a)) with cuts 100. Each discrete segment 105 substantially has a trapezoidal shape and corresponds to the discrete segment 73 in a radial direction.

The second liquid stopper 101-2 form narrowed gaps of different shapes between the common electrode 19 and the terminal 57-6 and between the discrete segments 105 like the first liquid stopper 69-2.

The second liquid stopper 101-2 is present between the terminal 57-5 and the common electrode 19. Inside the second liquid stopper 101-2, a liquid sealing adhesive 103 is filled and hardened, to form a sealing adhesive part 103a.

The sealing adhesive part 103a and second liquid stopper 101-2 cooperate to prevent the conductive adhesive part 71a from being exposed through the narrowed parts to the atmosphere. This prevents the corrosion of the conductive adhesive 71. Even if the conductive adhesive 71 corrodes, the sealing adhesive part 103a and second liquid stopper 101-2 prevent the conductive adhesive 71 from leaking outside.

FIGS. 14(a) and 14(b) illustrate a wiring connecting structure according to the third embodiment of the present invention, in which FIG. 14(a) is a front view and FIG. 14(b) is a sectional view taken along the line B-B of FIG. 4.

The wiring connecting structure according to the third embodiment employs a terminal 57-7 having a first liquid stopper 69-3 comprising circumferentially-arranged discrete segments 75 each having a cylindrical shape and a second liquid stopper 101-3 comprising circumferentially-arranged discrete segments 107 each having a cylindrical shape.

A sealing adhesive part 103a and the second liquid stopper 101-3 cooperate to prevent a conductive adhesive part 71a from being exposed through a narrowed part on the first liquid stopper 69-3 to the atmosphere. This prevents the corrosion of a conductive adhesive 71. Even if the conductive adhesive 71 corrodes, the sealing adhesive part 103a and second liquid stopper 101-3 prevent the conductive adhesive 71 from leaking outside.

According to the first, second, and third embodiments of the present invention, the second liquid stopper (101-1, 101-2, 101-3) is formed by leaving the conductive base 59 around the through hole 67 outside the first liquid stopper (69-1, 69-2, 69-3) when etching off the conductive base 59 in the area 65 (FIG. 5(b)).

The second liquid stopper (101-1, 101-2, 101-3) must electrically be insulated from the conductive base 59 that is left around the etched-off area 65 (FIG. 5(b)), to avoid a short circuit between the common electrode 19 and the conductive base 59.

Instead of forming the second liquid stopper (101-1, 101-2, 101-3) with the use of part of the conductive base 59 of the terminal 57, the second liquid stopper may be formed separate from the conductive base 59 (terminal 57). In this case, the conductive base 59 in the area 65 is completely removed by etching, and the discrete second liquid stopper is attached to the electric insulating layer 61.

According to the embodiments, the through hole 67 is formed through the electric insulating layer 61 and wiring 63 of the terminal 57. This does not limit the present invention. For example, the wiring 63 may have no through hole.

Figure 15:
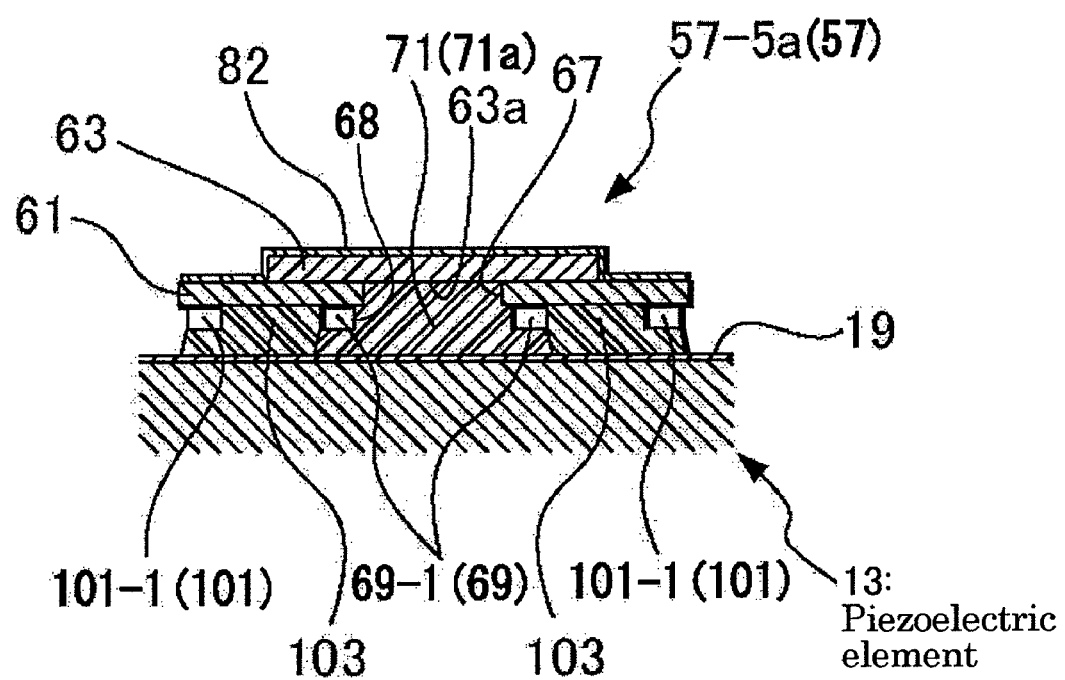
FIG. 15 is a sectional view illustrating a wiring connecting structure according to a modification of the first embodiment of the present invention.

FIG. 15 is a sectional view illustrating a wiring connecting structure according to a modification of the first embodiment of the present invention.

In FIG. 15, a through hole 67 is formed only through an electric insulating layer 61 of a terminal 57-5a and is not formed in wiring 63. In the terminal 57-5a, the wiring 63 is exposed through the through hole 67 of the insulating layer 61 to the piezoelectric element 13, to face the common electrode 19 of the piezoelectric element 13. A surface 63a of the wiring 63 facing the piezoelectric element 13 is brought in contact with a conductive adhesive part 71a formed in the through hole 67 of the insulating layer 61, to secure electric connection between the wiring 63 and the common electrode 19.

Returning to FIGS. 1 to 4, operation of the head suspension 31 will be explained. It is assumed that the first and second electrodes 15 and 17 of the piezoelectric element 13 are grounded and the common electrode 19 thereof receives a predetermined voltage.

The end face 23 disposed on the first electrode side contracts and the end face 25 disposed on the second electrode side extends as illustrated in FIG. 2, and therefore, the piezoelectric element 13 deforms into a trapezoid. Namely, the piezoelectric element 13 minutely moves in the direction Z to move the load beam 35 on the drive side Y in a sway direction (a widthwise direction of the head suspension 31).

If the common electrode 19 is grounded and the first and second electrodes 15 and 17 receive a predetermined voltage, the piezoelectric element 13 minutely moves in the direction −Z to move the load beam 35 on the drive side Y in the opposite sway direction.

The head suspension 31 incorporating the piezoelectric actuator 11 needs three electric systems for the first and second electrodes 15 and 17 and common electrode 19 of the piezoelectric element 13. This configuration makes wiring to the piezoelectric element 13 easy and reliable.

The base plate 33 accommodates the piezoelectric element 13 in the opening 43 and supports the same from below. The opening 43 of the base plate 33 surrounds the piezoelectric element 13, to easily position the piezoelectric element 13 and protect the brittle piezoelectric element 13 from being damaged.

The common electrode 19 and terminal 57 that face each other are electrically connected to each other through a single connection (the conductive adhesive 71). This configuration reduces the number of wires arranged on the flexure 39 and increases the number of flexures to be produced from a material.

Although the present invention has been explained with reference to the embodiments, the embodiments are not intended to restrict the present invention. The embodiments are modifiable without departing from the scope and technical idea of the present invention stipulated or suggested in the claims and specification. Wiring connecting structures for piezoelectric elements, wiring connecting methods, piezoelectric actuators, and head suspensions according to such modifications also fall in the scope of the present invention.

The "base plate" mentioned in the claims conceptually includes the base plate 33 and actuator plate 34. Accordingly, the "base plate" stipulated in the claims may be read as an "actuator plate". For example, "an opening formed in the base plate" may be read as "an opening formed in the actuator plate".

According to the embodiments, the piezoelectric actuator is arranged between the base plate 33 and the load beam 35. This does not limit the present invention.

The present invention is applicable to any piezoelectric actuator that is arranged between a base and a head. The piezoelectric actuator may be arranged on a carriage arm (actuator arm), to minutely move a head suspension, a magnetic head slider, or a magnetic head element.

According to the embodiments, the first and second liquid stoppers 69 and 101 are annular and are concentrically arranged, or are discrete trapezoidal segments 73 and 105 circumferentially arranged in double rings, or are discrete cylindrical segments 75 and 107 circumferentially arranged in double rings.

Figure 16:
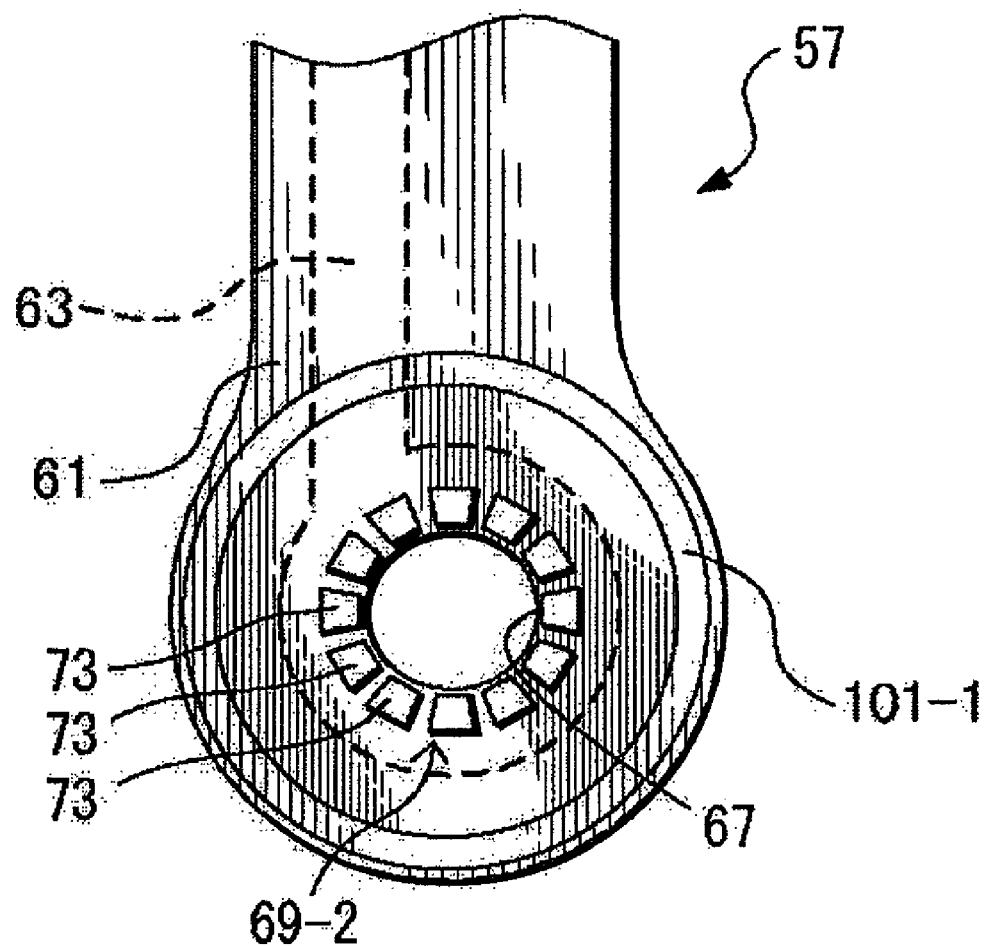
FIG. 16 is a view illustrating a combination of the first and second embodiments of the present invention.
Figure 17:
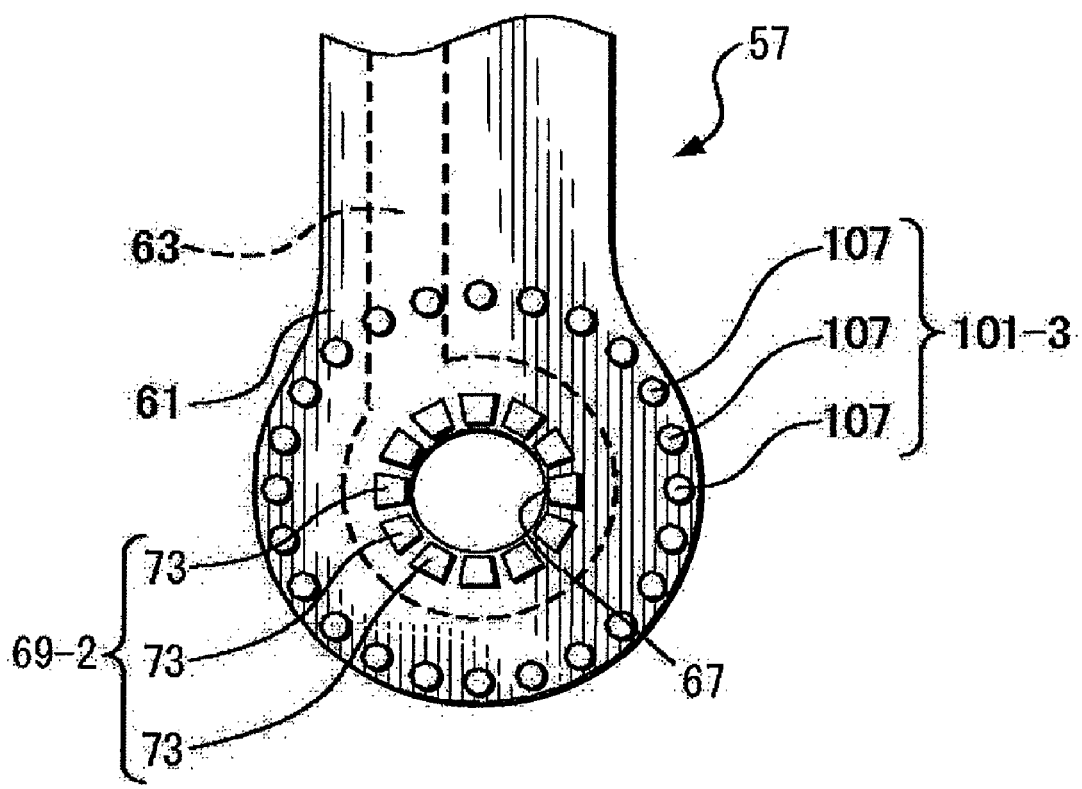
FIG. 17 is a view illustrating a combination of the second and third embodiments of the present invention.

The present invention allows other arrangements. For example, the first liquid stopper 69 may be one selected from the group comprising an annular liquid stopper, a liquid stopper made of circumferentially arranged trapezoidal segments, and a liquid stopper made of circumferentially arranged cylindrical segments and the second liquid stopper 101 may be another one in the same group, as illustrated in FIGS. 16 and 17.

In this way, the first and second liquid stoppers 69 and 101 may be made by properly combining various forms of liquid stoppers.

Figure 18:
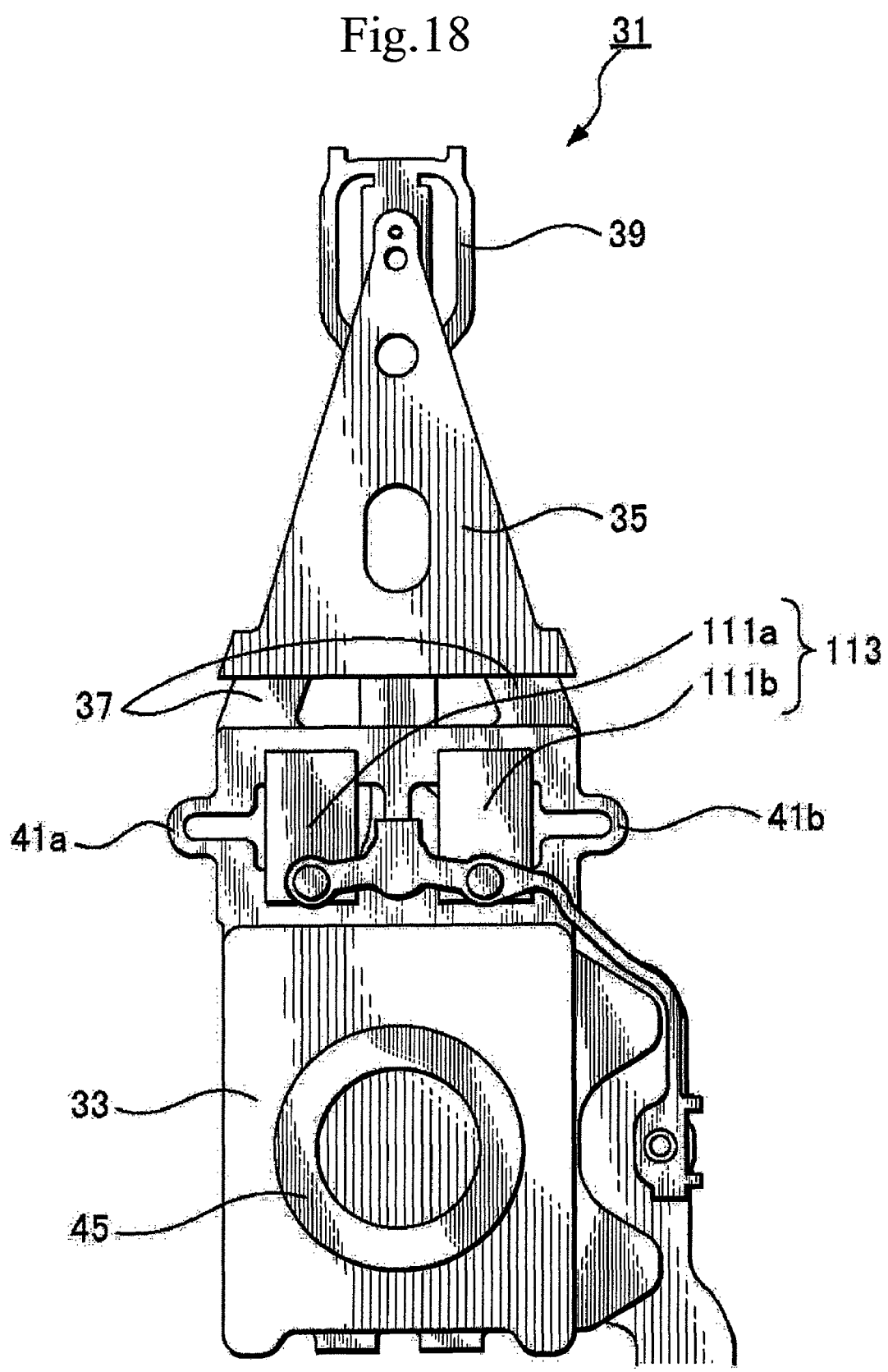
FIG. 18 is a view illustrating a head suspension according to a modification of the present invention.

According to the embodiments of the present invention, the piezoelectric actuator 11 employs one piezoelectric element 13 to which the wiring connecting structure is applied. This does not limit the present invention. FIG. 18 is a view illustrating a head suspension 31 incorporating a piezoelectric actuator 113 according to a modification of the present invention. The piezoelectric actuator 113 employs a pair of piezoelectric elements 111a and 111b and each of the piezoelectric elements 111a and 111b employs the wiring connecting structure of the present invention.

What is claimed is:

1. A wiring connecting structure for a piezoelectric element, the piezoelectric element being arranged between a base and head of an object, to minutely move the head in a sway direction according to deformation that occurs on the piezoelectric element in response to a voltage applied, the wiring connecting structure comprising:
    a terminal used to apply a voltage to the piezoelectric element;
    an electrode formed on the piezoelectric element;
    first and second liquid stoppers arranged between the terminal and the electrode, the second liquid stopper being arranged outside the first liquid stopper; and
    an adhesive part configured to connect the electrode to the terminal and having a conductive adhesive part defined by the first liquid stopper and a sealing adhesive part defined by the second liquid stopper and configured to seal the first liquid stopper and conductive adhesive part.

2. The wiring connecting structure of claim 1, wherein
    the terminal includes an electric insulating layer faced to the electrode of the piezoelectric element and a wiring layer formed on the electric insulating layer to be connected through the conductive adhesive part to the electrode; and
    the electric insulating layer is provided with a through hole through which the conductive adhesive part connects the wiring layer to the electrode.

3. The wiring connecting structure of claim 2, wherein
    at least one of the first and second liquid stoppers is annular to surround the through hole.

4. The wiring connecting structure of claim 2, wherein
    at least one of the first and second liquid stoppers includes discrete segments that are arranged in a circumferential direction to surround the through hole.

5. The wiring connecting structure of claim 4, wherein
    the discrete segments are selected from a group comprising segments formed by radially cutting an annular material, cylindrical segments, and a combination of these segments.

6. The wiring connecting structure of claim 2, further comprising:
    a wiring member arranged on the object and including a conductive base, an electric insulating layer formed on the conductive base, and a wiring layer formed on the electric insulating layer;
    the terminal formed on the wiring member; and
    the conductive base of the wiring member partly removed in an area corresponding to the electrode of the piezoelectric element.

7. The wiring connecting structure of claim 6, wherein
    at least one of the first and second liquid stoppers is made by partly leaving the conductive base when the electrode corresponding area of the conductive base is removed from the wiring member.

8. The wiring connecting structure of claim 2, wherein
    at least one of the first and second liquid stoppers is prepared separately from the terminal and the electrode of the piezoelectric element and is attached to one of the terminal and the electrode.

9. A wiring connecting method for the wiring connecting structure of claim 1, comprising:
    arranging the first liquid stopper between the terminal and the electrode of the piezoelectric element;

filling a conductive adhesive inside the first liquid stopper and hardening the conductive adhesive to form the conductive adhesive part;

arranging the second liquid stopper outside the first liquid stopper between the terminal and the electrode; and filling a sealing adhesive inside the second liquid stopper and hardening the sealing adhesive to form the sealing adhesive part.

10. The wiring connecting method of claim 9, further comprising:

temporarily hardening the sealing adhesive, and thereafter, fully hardening the conductive adhesive and sealing adhesive.

11. A piezoelectric actuator comprising the wiring connecting structure for a piezoelectric element of claim 1.

12. A head suspension comprising the piezoelectric actuator of claim 11, a base plate, a load beam, and a flexure, the piezoelectric actuator being arranged between the base plate and the load beam, to minutely move a front end of the load beam in a sway direction according to deformation that occurs on the piezoelectric element in response to a voltage applied to the piezoelectric element.

* * * * *